(12) United States Patent
Randolph et al.

(10) Patent No.: US 6,911,704 B2
(45) Date of Patent: Jun. 28, 2005

(54) MEMORY CELL ARRAY WITH STAGGERED LOCAL INTER-CONNECT STRUCTURE

(75) Inventors: Mark W. Randolph, San Jose, CA (US); Sameer S. Haddad, Santa Jose, CA (US); Timothy Thurgate, Sunnyvale, CA (US); Richard Fastow, Cupertino, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 80 days.

(21) Appl. No.: 10/685,044

(22) Filed: Oct. 14, 2003

(65) Prior Publication Data
US 2005/0077567 A1 Apr. 14, 2005

(51) Int. Cl.[7] .............................................. H01L 27/082
(52) U.S. Cl. ....................... 257/390; 257/314; 257/315; 257/316
(58) Field of Search ................................. 257/390, 315, 257/314, 316

(56) References Cited

U.S. PATENT DOCUMENTS

| 4,281,397 | A |   | 7/1981  | Neal et al. |         |
|-----------|---|---|---------|-------------|---------|
| 5,440,518 | A | * | 8/1995  | Hazani      | 365/218 |
| 5,671,177 | A |   | 9/1997  | Ueki        |         |
| 5,712,179 | A | * | 1/1998  | Yuan        | 438/588 |
| 6,377,499 | B1| * | 4/2002  | Tobita      | 365/222 |
| 6,473,327 | B1| * | 10/2002 | Ishizuka    | 365/103 |
| 6,643,159 | B2| * | 11/2003 | Fricke et al. | 365/51 |

FOREIGN PATENT DOCUMENTS

EP      0 645 713 A1      3/1995

OTHER PUBLICATIONS

International Search Report for corresponding Application No. PCT/US2004/030415 mailed Jan. 25, 2005.

* cited by examiner

*Primary Examiner*—Thao P. Le
(74) *Attorney, Agent, or Firm*—Renner, Otto, Boisselle, & Sklar, LLP

(57) ABSTRACT

A memory cell array comprises a two dimensional array of memory cells fabricated on a semiconductor substrate. The memory cells are arranged in a plurality of rows and a plurality columns. Each column of memory cells comprising a plurality of alternating channel regions and source/drain regions. A conductive interconnect is positioned above each source/drain region and coupled to only one other source/drain region. The one other source/drain region is in a second column that is adjacent to the column. The conductive interconnects are positioned such that every other conductive interconnect connects to the adjacent column to a right side of the column and every other conductive interconnect connects to adjacent column to the left side of the column. A plurality of source/drain control lines extends between adjacent columns of memory cells and electrically couples to each conductive interconnect that couples between the adjacent columns.

24 Claims, 21 Drawing Sheets

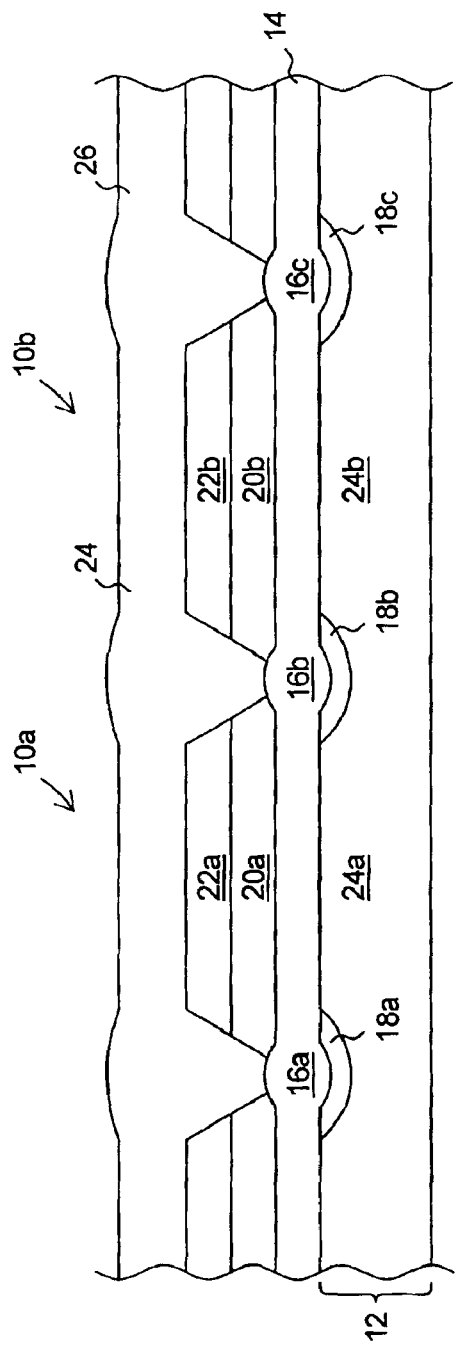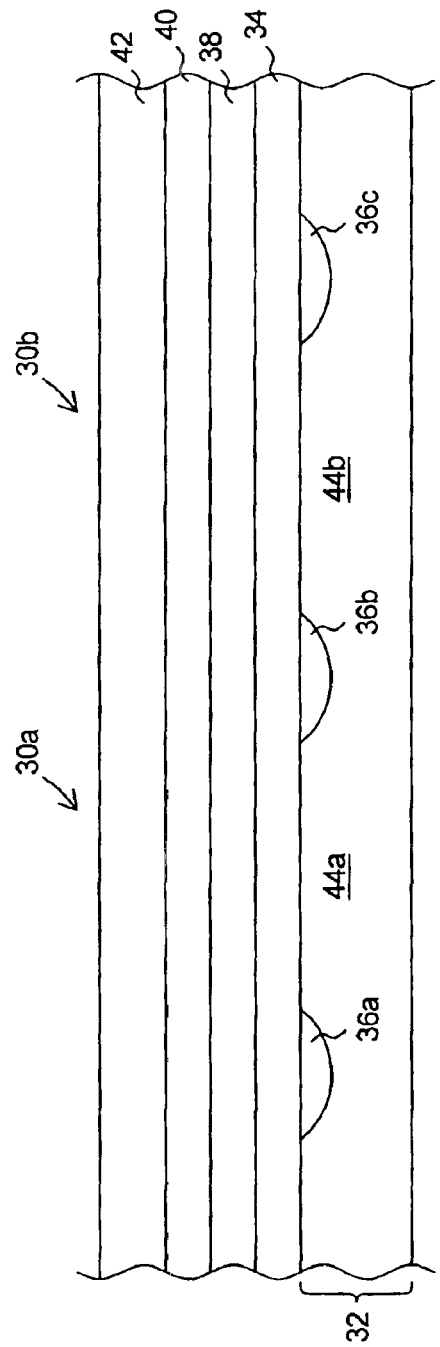
FIG. 1a
Prior Art
FIG. 1b
Prior Art

MEMORY CELL ARRAY WITH STAGGERED LOCAL INTER-CONNECT STRUCTURE

TECHNICAL FIELD

The present invention relates generally to flash memory cell devices and more specifically, to reduction of bit line resistance in self aligned charge trapping dielectric memory cell structures.

BACKGROUND OF THE INVENTION

Conventional floating gate flash memory types of EEPROMs (electrically erasable programmable read only memory); utilize a memory cell characterized by a vertical stack of a tunnel oxide ($SiO_2$), a polysilicon floating gate over the tunnel oxide, an interlayer dielectric over the floating gate (typically an oxide, nitride, oxide stack), and a control gate over the interlayer dielectric positioned over a crystalline silicon substrate. Within the substrate are a channel region positioned below the vertical stack and source and drain diffusions on opposing sides of the channel region.

The floating gate flash memory cell is programmed by inducing hot electron injection from the channel region to the floating gate to create a non volatile negative charge on the floating gate. Hot electron injection can be achieved by applying a drain to source bias along with a high control gate positive voltage. The gate voltage inverts the channel while the drain to source bias accelerates electrons towards the drain. The accelerated electrons gain 5.0 to 6.0eV of kinetic energy which is more than sufficient to cross the 3.2eV Si—$SiO_2$ energy barrier between the channel region and the tunnel oxide. While the electrons are accelerated towards the drain, those electrons which collide with the crystalline lattice are re-directed towards the Si—$SiO_2$ interface under the influence of the control gate electrical field and gain sufficient energy to cross the barrier.

Once programmed, the negative charge on the floating gate increases the threshold voltage of the FET characterized by the source region, drain region, channel region, and control gate. During a "read" of the memory cell, the magnitude of the current flowing between the source and drain at a predetermined control gate voltage indicates whether the flash cell is programmed.

More recently charge trapping dielectric memory cell structures have been developed. A first embodiment, as represented by the cross section diagram of FIG. 1a, includes a bit line oxide structure. The cells 10a and 10b are fabricated on a semiconductor substrate 12. Each cell 10 is characterized by a vertical stack of an insulating tunnel layer 14, a charge trapping dielectric layer 20a, 20b, and a top dielectric layer 22a, 22b formed over channel regions 24a, 24b of the substrate 12. Such stack may be referred to as an ONO stack because the insulating tunnel layer 14 and the top dielectric layer 22 are typically an oxide while the center charge trapping dielectric layer is typically a nitride compound. The channel regions 24 are separated from each other, and defined by, bitline implants 18a, 18b, and 18c within the substrate 12. The ONO stacks are separated from each other, and defined by bit line oxide regions 1 6a, 16b, and 16c which are areas of the tunnel dielectric layer 14 above the bit line implants 18 that are thicker than the areas of the tunnel dielectric layer 14 that are over the channel regions 24.

Above the ONO stacks are a plurality of spaced apart polysilicon word lines 26 that are perpendicular to the bit line implants 18. Each word line is positioned above the top dielectric layer 22b of all calls within a row and each word line is perpendicular to the bit lines.

Similar to the floating gate device, the charge trapping dielectric memory cell 10 is programmed by inducing hot electron injection from the channel region 24 to the nitride layer 20 to create a non volatile negative charge within charge traps existing in the nitride layer 20. Again, hot electron injection can be achieved by applying a drain-to-source bias (e.g. bit line 18b to bit line 18a bias for programming cell 10a) along with a high positive voltage on the polysilicon word line 26 which forms a control gate over the cell 10a. The high voltage on the word line 26 inverts the channel region 24a while the drain-to-source bias accelerates electrons towards the drain bitline 18b. The accelerated electrons gain 5.0 to 6.0 eV of kinetic energy which is more than sufficient to cross the 3.2 eV Si—$SiO_2$ energy barrier between the channel region 24 and the tunnel oxide layer 14. While the electrons are accelerated towards the drain bitline 18b, those electrons which collide with the crystalline lattice are re-directed towards the Si—$SiO_2$ interface under the influence of the control gate electrical field and have sufficient energy to cross the barrier.

Because the charge trapping layer 20 stores the injected electrons within traps and is otherwise a dielectric, the trapped electrons remain localized within a charge storage region that is dose to the drain region bit line to which the positive voltage was applied. As such, the charge trapping dielectric memory device can be used to store two bits of data, one near each of the bit lines of each cell.

The array is typically fabricated by first applying the ONO layer to the top surface of the substrate, etching back the ONO layer to the top surface of the substrate in the bit line regions, implanting the bit line regions, oxidizing the bit line regions to form the bit line oxides, and then applying the word lines to the top of the remaining ONO layer and the bit line oxides.

A second embodiment of a charge trapping dielectric memory cell structure is a planar structure as represented by the diagram of FIG. 1b. Cells 30a and 30b are fabricated on a semiconductor substrate 32. Positioned over the semiconductor substrate 32 is a vertical stack of an insulating tunnel layer 34, a charge trapping dielectric layer 38, and a top dielectric layer 40 positioned over the substrate 32.

Within the substrate are a plurality of parallel, and spaced apart, bit line implants 36a, 36b, and 36c which define a plurality of channel regions 44a, 44b, each of which is between adjacent bit line implants. Above the top dielectric layer 40 are a plurality of parallel, spaced apart, polysilicon word lines which are perpendicular to the bit line implants 36 and the channel regions 44. Each dielectric memory cell is defined by an intersection of a word line 42 and a channel region 44.

A challenge with existing memory cell array structures is that the dimensions are large. First, it should be appreciated that each bit line has a high resistance. It has been empirically determined that using present fabrication technologies that a bit line may have on the order of 100 Ohms of resistance per bit line. As such, accurate control of bit line voltage at a particular cell requires that bit lines be quite wide and that multiple contacts be placed within the array such that each cell is relatively close to a contact. The wide bit lines and the quantity of contacts within the core region of a memory array increases the overall dimension of an array of cells.

Secondly, the architecture wherein bit lines are implanted within the substrate and run perpendicular to word lines combined with the wide bit line requirement further increases the overall dimension of an array of cells.

Consequently, In accordance with a generalized industry need to reduce the size of memory cell arrays, a specific need exists for a memory cell architecture, and a fabrication process therefore, that provides for a more compact arrangement of memory cells within the array without suffering the disadvantages stated above.

SUMMARY OF THE INVENTION

A first aspect of the present invention is to provide a memory cell array with a staggered local interconnect pattern. The memory cell array may utilize either floating gate charge storage cell or a charge trapping dielectric charge storage cell.

The array is fabricated on a semiconductor substrate as a two dimensional array with a plurality of rows of memory cells defining a horizontal row direction and a plurality columns of memory cells defining a column direction that is perpendicular to the horizontal row direction.

Each column of memory cells comprises a plurality of alternating channel regions and source/drain regions within the substrate. More specifically, each channel region of the substrate is separated from an adjacent channel region within the column by a source/drain region. Each source/drain region comprises a portion of the substrate that is implanted with a first impurity to form a first conductivity type semiconductor.

The array includes a plurality of conductive interconnects arranged in a staggered pattern. A single one of the conductive interconnects is positioned above each source/drain region within a first column and couples to only one other source/drain region. The one other source/drain region is in a second column that is adjacent to the first column and is in the same row as the source/drain region. The conductive interconnects are positioned in a staggered pattern such that every other conductive interconnect connects to the second source/ drain region in the adjacent column to a right side of the first column and every other conductive interconnect connects to the second source drain region in the adjacent column to the left side of the first column.

A plurality of source/drain control lines extending above the array in the column direction and are positioned between adjacent columns of memory cells. Each source/drain control line electrically couples to each conductive interconnect that couples between a source/drain region in each of the adjacent columns.

A charge storage cell is positioned above each channel region. The charge storage cell may be either a floating gate charge storage cell or a charge trapping dielectric charge storage cell. A charge in the charge storage cell effects depletion within the channel region.

A plurality of conductive word lines extend across the top of each charge storage cell within a row or memory cells and forms a gate electrode over each charge storage cell within the row.

Each column of memory cells is separated from the adjacent column of memory cells by an insulator channel region within the substrate. The insulator channel region defines sides, in the horizontal direction, of each source/drain region and each channel region within the column of memory cells.

Each of the source/drain control line may be positioned above the word lines, isolated from the word lines, and spaced apart from each conductive interconnect The source/drain control line is coupled to each conductive interconnect by a conductive via. Each conductive via extends from a source/drain control line to only one of the plurality of conductive interconnects.

A second aspect of this invention is also to provide a memory cell array with a staggered local interconnect pattern that includes one source/drain region between adjacent cells that floats. The array is fabricated on a semiconductor substrate as a two dimensional array with a plurality of rows of memory cells defining a horizontal row direction and a plurality columns of memory cells defining a column direction that is perpendicular to the horizontal row direction.

Each column of memory cells comprises a plurality of channel regions within the substrate. Each channel region of the substrate is separated from an adjacent channel region within the column by a source/drain region. Each source drain region is a portion of the substrate that is implanted with a first impurity to form a first conductivity type semiconductor.

The array includes a plurality of conductive interconnects. A single one of the conductive interconnects is positioned above only every second source/drain region within a first column of memory cells and couples to only one other source/drain region. The one other source/drain region begin in a second column that is adjacent to the first column and being in the same row as the source/drain region. The conductive interconnects are positioned such that every other conductive interconnect connects to the second source drain region in the adjacent column to a right side of the first column and every other interconnect connects to the second source drain region in the adjacent column to the left side of the first column. Every other second source/drain region within the first column is isolated from all conductive interconnects and floats.

A plurality of source/drain control lines extending above the array in the column direction and are positioned between adjacent columns of memory cells. Each source/drain control line electrically couples to each conductive interconnect that couples between a source/drain region in each of the adjacent columns.

Again, a charge storage cell is positioned above each channel region. The charge storage cell may be either a floating gate charge storage cell or a charge trapping dielectric charge storage cell. A charge in the charge storage cell effects depletion within the channel region.

Again, plurality of conductive word lines extend across the top of each charge storage cell within a row or memory cells and forms a gate electrode over each charge storage cell within the row.

Again, each column of memory cells is separated from the adjacent column of memory cells by an insulator channel region within the substrate. The insulator channel region defines sides, in the horizontal direction, of each source/drain region and each channel region within the column of memory cells.

Again, each of the source/drain control line may be positioned above the word lines, isolated from the word lines, and spaced apart from each conductive interconnect. The source/drain control line is coupled to each conductive interconnect by a conductive via. Each conductive via extends from a source/drain control line to only one of the plurality of conductive interconnects.

For a better understanding of the present invention, together with other and further aspects thereof, reference is made to the following description, taken in conjunction with the accompanying drawings. The scope of the invention Is set forth in the appended dams.

BRIEF DESCRIPTION OF THE DRAWINGS

FIG. 1a is a schematic, cross sectional view of a portion of a row of charge trapping dielectric memory cells with a bit line oxide structure in accordance with the prior art;

FIG. 1b is a schematic, cross sectional view of a portion of a row of charge trapping dielectric memory cells with a planar structure in accordance with the prior art;

DESCRIPTION OF THE PREFERRED EMBODIMENTS

Figure 2:
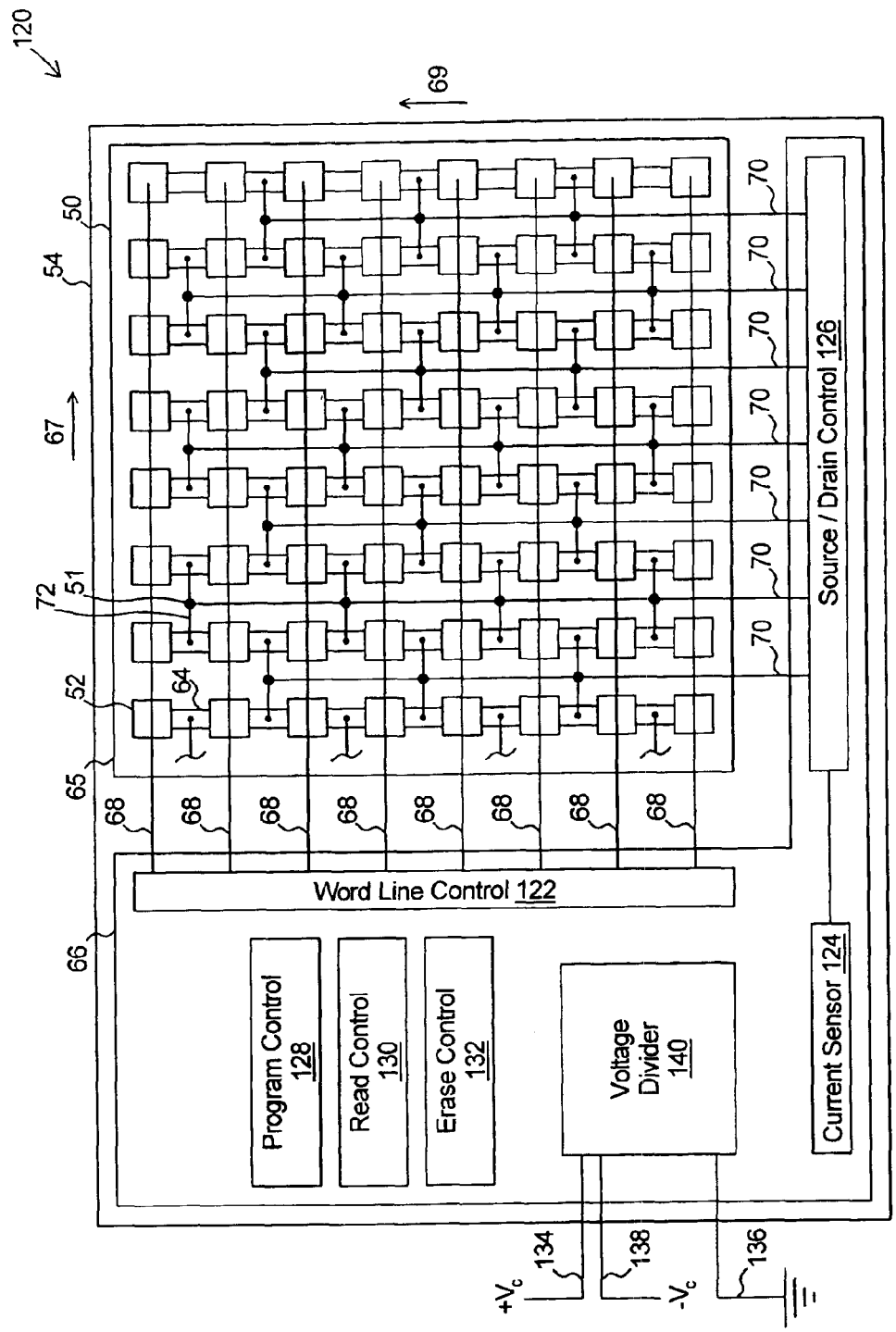
FIG. 2 is a block diagram representing a first exemplary embodiment of a staggered local interconnect structure memory array.

The present invention will now be described in detail with reference to the drawings. In the drawings, like reference numerals are used to refer to like elements throughout. Further, the diagrams are not drawn to scale and the dimensions of some features are intentionally drawn larger than scale for purposes of showing clarity.

FIG. 2 represents a block diagram of an integrated circuit memory system 120. The integrated circuit 120 comprises a staggered local interconnect charge storage memory cell array 50. The memory cell array 50 comprises a plurality of charge storage memory cells 52 fabricated in a core region 65 of a substrate 54 and control circuits fabricated in a periphery region 66 of the substrate 54. The array 50 of memory cells 52 in the core region 65 is arranged in a two dimensional array, or matrix, format with a plurality of rows or memory cells defining a horizontal row direction 67 and a plurality of columns of memory cells defining a column direction 71.

Word lines 68 are positioned across the array 50 in a first direction (referred to as horizontal) and form a gate electrode over each of a plurality of memory cells 52 in a horizontal row. Source/drain control lines 70 are positioned across the array 50 in a second direction (referred to as vertical) that is perpendicular to the first direction and couples to a plurality of source/drain regions 64 which are positioned within the substrate 54 between pairs of adjacent word lines 68.

The source/drain control lines 70 are positioned above the array 50 and each couples to a plurality of vias 51. Each via 51 extends downward to only one conductive interconnect 72. Each conductive interconnect extends in the horizontal row direction 67 between two adjacent source/drain regions 64. The plurality of conductive interconnects 72 are arranged in a staggered pattern such that each source/drain region 64 couples to only one interconnect 72 and such that the two source/drain regions 64 on opposing sides of each channel region (beneath the cell 52) in the column direction 71 are coupled by the conductive interconnects 72 and vias 51 to adjacent source/drain control lines 70.

Stated another way, each conductive interconnect 72 is positioned above each source/drain region 64 within a first column and couples to only one other source/drain region 64. The one other source/drain region 64 begin in a second column that is adjacent to the first column and being in the same row as the source/drain region 64. The conductive interconnects 72 are positioned such that every other conductive interconnect 72 connects to the second source/drain region 64 in the adjacent column to a right side of the first column and every other conductive interconnect 72 connects to the second source drain region in the adjacent column to the left side of the first column.

The control circuits within the periphery region 66 may comprise transistor gate logic circuits that include a word line control circuit 122, a source/drain control circuit 126, a current sensor 124, a program control circuit 128, a read control circuit 130, an erase control circuit 132, a voltage divider circuit 140, a coupling to a positive operating power source (Vc) 134, a coupling to a negative operating power source (-Vc) 138, and a coupling to a ground 136. Each of such components may utilize known circuits for performing the functions disclosed herein.

In operation, the array control circuits operate to selectively couple each word line 68 and each source/drain line 70 to a voltage provided by the voltage divider 140 or to ground (or to isolate the word line 68 or the source/drain line 70 from all voltage sources and ground such that is potential is effected only by electrical interaction with other structure of the array 50). The coupling is in such a manner that each memory cell 52 within the array 50 can be erased, selectively programmed, and selectively read. The array control circuits also operates to couple a selected source/drain line 70 to the current sensor 124 such that a current on the selected source/drain line 70 may be measured to indicate the programmed state of a selected memory cell 52.

Charge Trapping Dielectric Cell Embodiment

Figure 3:
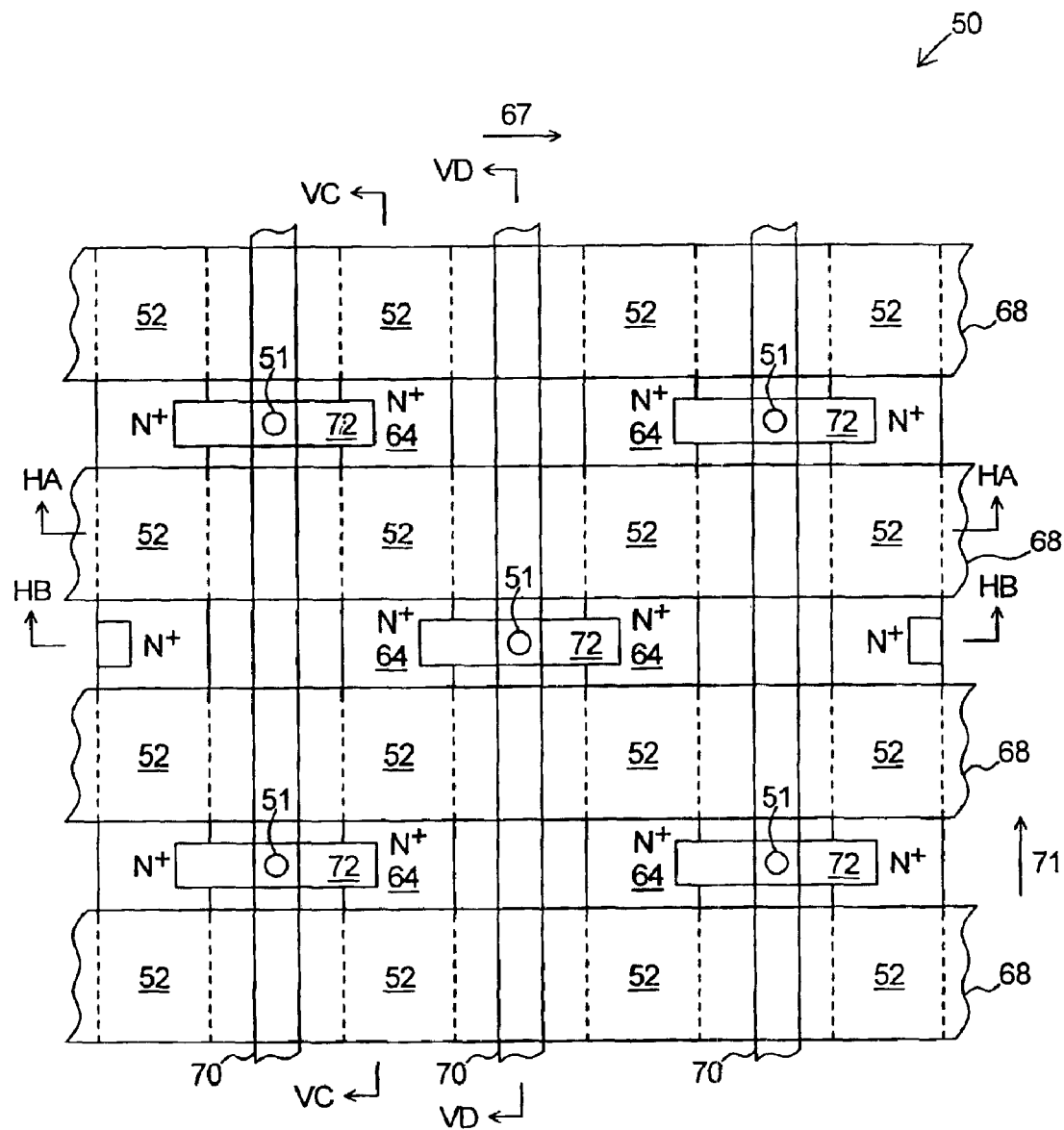
FIG. 3 is a top view of an exemplary embodiment of a staggered local interconnect structure memory array.
Figure 4A:
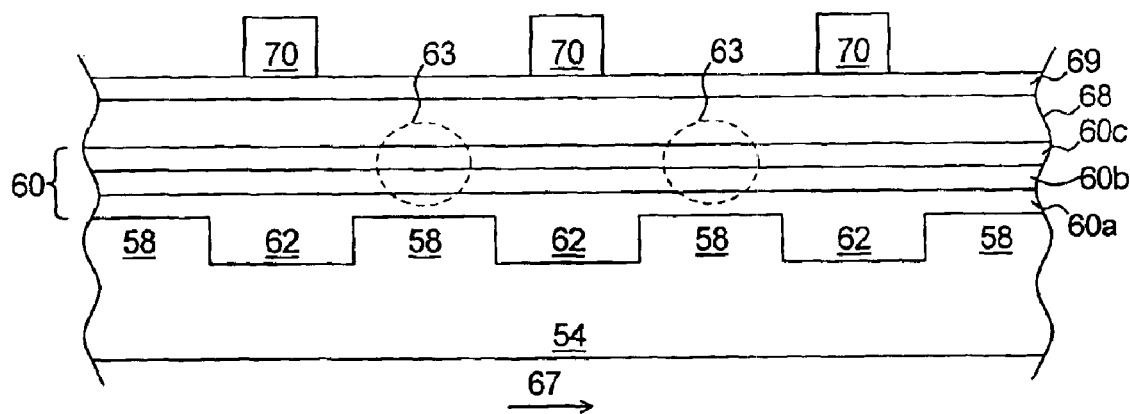
FIGS. 4a and 4b are cross section views in a row direction of a charge trapping embodiment of the staggered local interconnect structure memory array of FIG. 3.
Figure 4B:
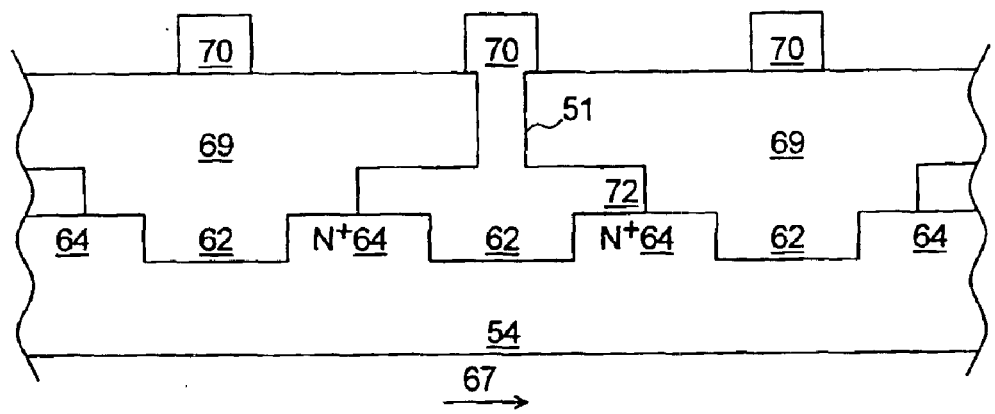
Figure 4D:
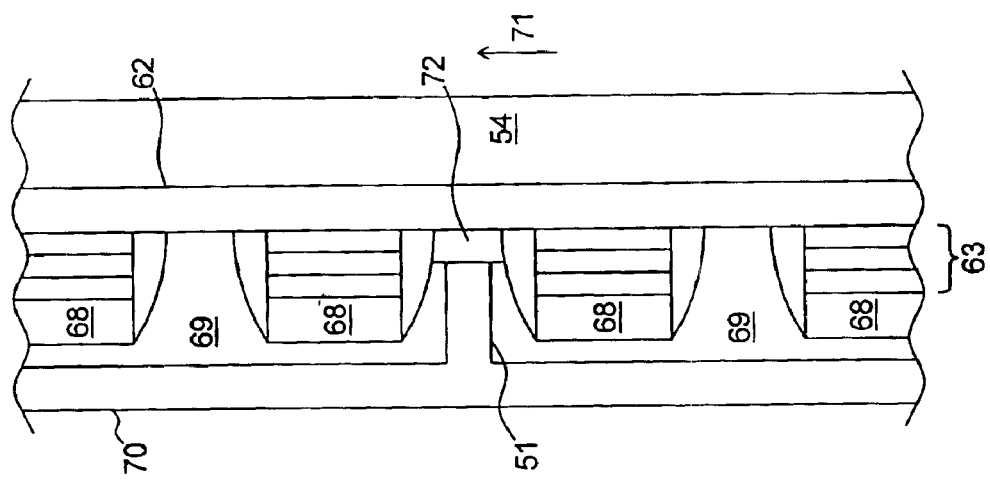
FIGS. 4c and 4d are cross section views in a column direction of a charge trapping embodiment of the staggered local interconnect structure memory array of FIG. 3.
Figure 4C:
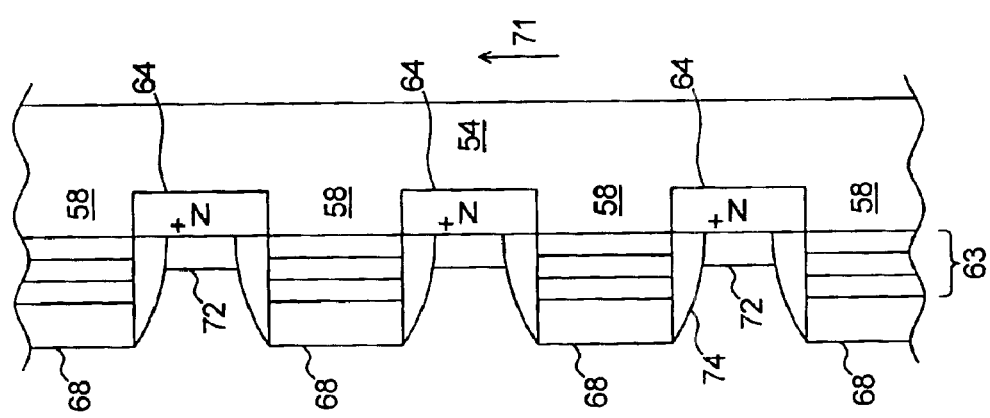

FIG. 3 depicts a top view of an exemplary embodiment of the staggered local interconnect charge storage memory cell array 50. FIGS. 4a and 4b each represent a horizontal row cross sectional view of the memory cell array 50 fabricated utilizing charge trapping memory cell technology at cross section lines HA—HA and HB—HB of FIG. 3 respectively. FIGS. 4c and 4d each represent a column cross sectional view of the memory cell array 50 fabricated utilizing charge trapping memory cell technology at cross section lines VC—VC and VD—VD of FIG. 3 respectively.

Referring to FIGS. 3 in conjunction with FIGS. 4a through 4d, the memory cell array 50 comprises a plurality of memory cells 52 fabricated on a crystalline semiconductor substrate 54 which is lightly implanted with a hole donor impurity such as Boron so that the substrate 54 is a lightly doped p-type conductivity semiconductor.

Each memory cell 52 comprises the word line 68 (functioning as a gate electrode) positioned over plurality of channel regions 58 of the substrate 54 within a row. Between adjacent pairs of channel regions 58 in the horizontal direction 67 is an insulating trench 62. Between adjacent pairs of channel regions 58 in the column direction 71 is an implanted source/drain region 64.

Each implanted source/drain region 64 includes a portion of the substrate 54 that is implanted with an electron donor-impurity, such as arsenic, to create a n-type conductivity semiconductor in the source/drain implant region 64. In the column direction 71, each source/drain implant region 64 forms a semiconductor junction with each of the two channel regions 58 on opposing sides thereof.

Between the channel region 58 and the word line is a charge storage cell 63. In this charge trapping dielectric memory cell embodiment, the charge storage cell comprises a multi-level charge trapping dielectric 60. The multi layer charge trapping dielectric 60 comprises a first insulating banner, or tunnel layer 60a, which may comprise silicon dioxide. The thickness of the tunnel layer 60a may be within a range of about 50 to about 150 angstroms. An embodiment with a more narrow bracket includes a tunnel layer 60a thickness within a range of about 60 to about 90 angstroms and even narrower yet, a tunnel layer 60a with a thickness of about 70to about 80angstroms.

On the surface of the tunnel layer 60a is a charge trapping dielectric layer 60b that includes one or more charge trapping regions for storing a neutral charge representing an un-programmed state or a negative charge representing a programmed state. The charge trapping layer 60b may comprise a compound with suitable charge trapping properties such as a charge trapping sheet density on the order of $3 \times 10^6$ electrons per square centimeter and a thickness such that non-uniformities in the charge trapping dielectric layer 60b thickness do not detrimentally effect operation.

In the exemplary embodiment, suitable charge trapping dielectric layer 60b may be a nitride compound such as a nitride compound selected from the group consisting of $Si_2N_4$, $Si_3N_4$ and $SiO_xN_4$. Further, in the exemplary embodiment, the charge trapping dielectric layer 60b may have a thickness on the order of 20to 100angstroms, or, an embodiment with a more narrow range may include a thickness on the order of 30to 50angstroms.

On the surface of the charge trapping dielectric layer 60b is a top dielectric layer 60c. The top dielectric layer 60c may be silicon dioxide or may be a material with a dielectric constant greater than the dielectric constant of silicon dioxide (e.g. a high K material). In a preferred embodiment, the high K material may be selected from the group of materials consisting of $Al_2O_3$, $HfSi_xO_y$, $HfO_2$, $ZrO_2$, and $ZrSi_xO_y$ and other materials with similarly high dielectric constants. If the top dielectric layer 60c is silicon dioxide, the layer 60c may have a thickness on the order of 60to 100angstroms. Alternatively, if the top dielectric layer 60c is a high K material, its electrical thickness may be on the order of 60to 100angstroms while its physical thickness may be within a range of about 70to 130angstroms. An embodiment with a more narrow bracket includes a top dielectric layer 60c with a physical thickness within a range of about 80to about 120angstroms and even narrower yet, a top dielectric layer 60c with a physical thickness of about 90to about 100angstroms.

On the surface of the top dielectric layer 60c is the word line 68. The word line 68 may be a conductor or a semiconductor such a polycrystalline silicon. On each side of each of the word lines 68 and charge storage cell 63 is a side wall insulating spacer 74. In the exemplary embodiment, the insulating spacer 74 may be formed of a nitride compound. The thickness of the insulating spacer 74 is of a thickness to prevent any current flow from the word line 68 or the charge storage cell 63 to any of the: i) source/drain region 64, ii) the conductive interconnect 72, and iii) any vias that may connect between the conductive interconnect 72 and metal layers (not shown) above the word line 68.

Each source/drain control line 70 extends across the array 50 in the column direction 71 and is isolated from the horizontal word lines 68 by an insulator 69. Each conductive interconnect 72 is positioned above only two adjacent (in the horizontal direction 67) source/drain regions 64 and electrically couples each of such only two source drain regions 64 to the via 51. The via 51 is positioned over the insulating trench 62 between the two source/drain regions 64 and extends beneath the source/drain control line 70. The via couples the interconnect 72 to the source/drain control line 70.

It should be appreciated that the above described architecture may provide for a smaller memory cell array than traditional architectures. The source/drain regions 64 are positioned on adjacent sides of channel regions 58 in the column direction as opposed to a row direction in a traditional array. Further, the source/drain regions 64 are each coupled to a conductive source/drain control lines 70 which eliminates the above described problems associated with high bit line resistances.

Figure 5A:
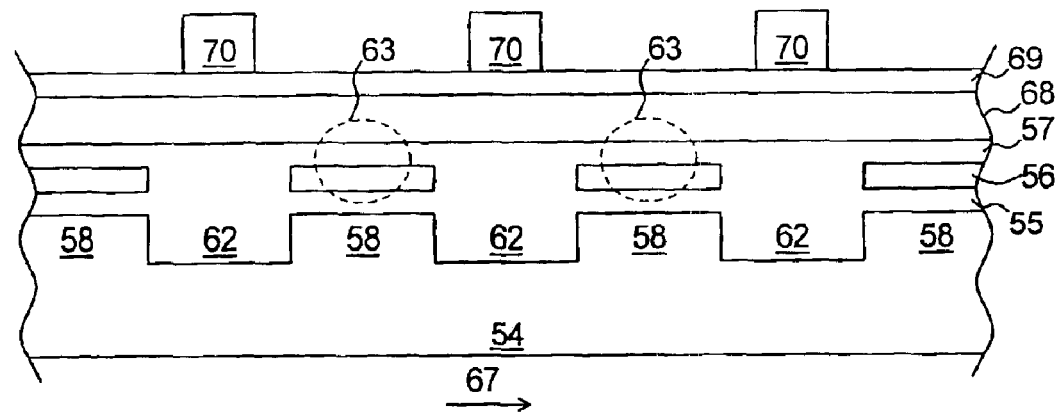
FIGS. 5a and 5b are cross section views in a row direction of a floating gate embodiment of the staggered local interconnect structure memory array of FIG. 3.
Figure 5B:
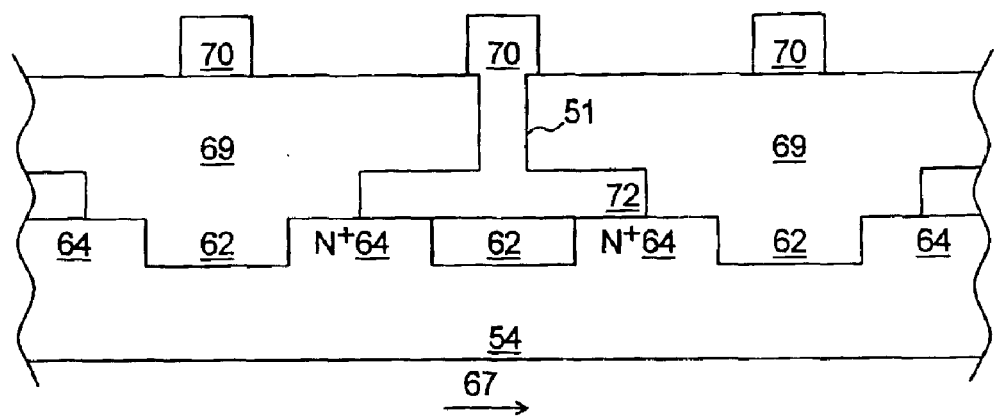
Figure 5C:
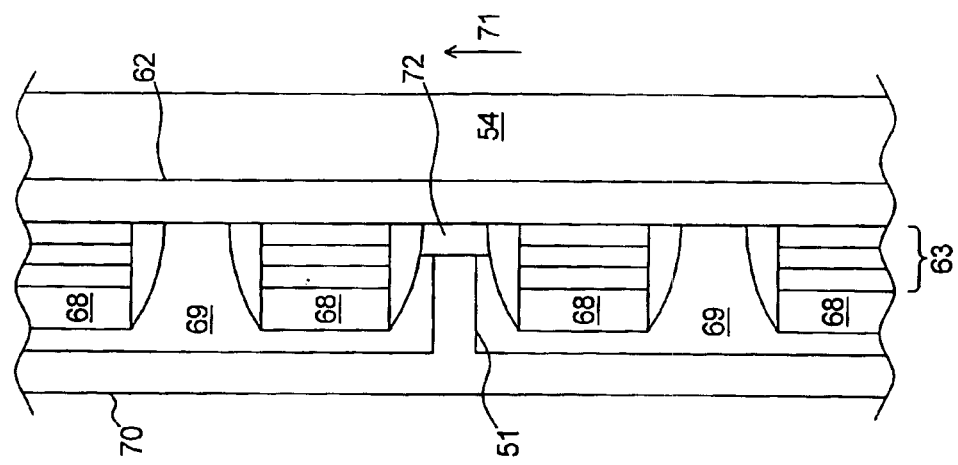
FIGS. 5c and 5d are cross section views in a column direction of a floating gate embodiment of the staggered local interconnect structure memory array of FIG. 3.
Figure 5D:
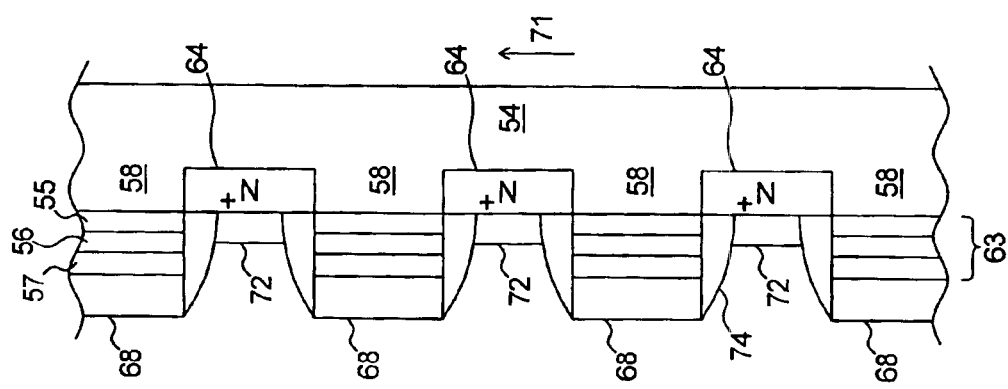

Floating Gate Cell Embodiment FIGS. 5a and 5b each represent a horizontal row cross sectional view of the memory cell array 50 fabricated utilizing floating gate memory cell technology at cross section lines HA—HA and HB—HB of FIG. 3 respectively. FIGS. 5c and 5d each represent a column cross sectional view of the memory cell array 50 fabricated utilizing floating gate memory cell technology at cross section lines VC—VC and VD—VD of FIG. 3 respectively.

As discussed above with respect to the charge trapping embodiment, the memory cell array 50 of FIG. 3 comprises a plurality of memory cells 52 fabricated on a crystalline semiconductor substrate 54. The semiconductor substrate 54 is lightly implanted with a hole donor impurity such as Boron so that the substrate 54 is a lightly doped p-type conductivity semiconductor.

Each memory cell 52 comprises the word line 68 (functioning as a gate electrode) positioned over a plurality of channel regions 58 of the substrate 54 within a row. Between adjacent pairs of channel regions 58 in the horizontal direction 67 is an insulating trench 62. Between adjacent pairs of channel regions 58 in the column direction is an implanted source/drain region 64.

Each implanted source/drain region 64 includes a portion of the substrate 54 that is implanted with an electron donor impurity, such as arsenic, to create a n-type conductivity semiconductor in the source/drain implant region 64. Each source/drain implant region 64 forms a semiconductor junction with each of the two body regions 58 on adjacent sides thereof in the column direction 71.

A charge storage cell 63 is positioned between the channel region 58 and the word line 68. In this floating gate embodiment, the charge storage cell comprises a floating gate 56 which is isolated from the body region by a tunnel dielectric layer 55 and isolated from the word line 68 by a top dielectric layer 57, The tunnel dielectric layer 55 may be silicon dioxide within a thickness range of about 50to about 150angstroms. An embodiment with a more narrow bracket includes a tunnel layer 55 thickness within a range of about 60to about 90angstroms and even narrower yet, a tunnel layer 55 with a thickness of about 70to about 80angstroms.

The top dielectric layer 57 may also be silicon dioxide or may be a material with a dielectric constant greater than the dielectric constant of silicon dioxide (e.g. a high K material). In a preferred embodiment, the high K material may be selected from the group of materials consisting of $Al_2O_3$, $HfSi_xO_y$, $HfO_2$, $ZrO_2$, and $ZrSi_xO_y$, and other materials with similarly high dielectric constants. If the top dielectric layer 57 is silicon dioxide, the layer 57 may have a thickness on the order of 60 to 100 angstroms. Alternatively, if the top dielectric layer 57 is a high K material, its electrical thickness may be on the order of 60to 100angstroms while its physical thickness may be within a range of about 70to 130angstroms. An embodiment with a more narrow bracket includes a top dielectric layer 57 with a physical thickness within a range of about 80to about 120angstroms and even narrower yet, a top dielectric layer 57 with a physical thickness of about 90to about 100angstroms.

Between the tunnel layer 55 and the top dielectric layer 57 is the floating gate 56. The floating gate may be polysilicon. The thickness of the floating gate 56 only needs to be adequate to store a charge require to affect depletion within the channel region 58. In the exemplary embodiment, the floating gate 56 may have a thickness on the order of 200to 1,500angstroms, or, an embodiment with a more narrow range may include a thickness on the order of 500to 1,000.

On the surface of the top dielectric layer 57 is the word line 68. On each side of each of the word line 68 and the charge storage cell 63 is a side wall insulating spacer 74. As discussed, the insulating spacer 74 may be formed of a nitride compound. The thickness of the insulating spacer 74 is of a thickness to prevent any current flow from the word line 68 or the floating gate 56 to any of the: i) source/drain region 64, ii) the conductive interconnect 72, and iii) any vias 51 that may connect between the conductive interconnect 72 and metal layers (not shown) above the word line 68.

Each source/drain control line 70 extends across the array 50 in the column direction 71 and is isolated from the word lines 68 by an insulator 69. Each interconnect 72 is positioned above only two adjacent (in the horizontal direction 69) source/drain regions 64 and electrically couples each such source drain region 64 to the via 51. The via 51 is positioned over the insulating trench between the 62 which is between the two source/drain regions 64 and extends beneath the source/drain control line 70. The via couples the interconnect 72 to the source/drain control line 70.

Fabrication of Charge Trapping Dielectric Embodiment

Figure 6:
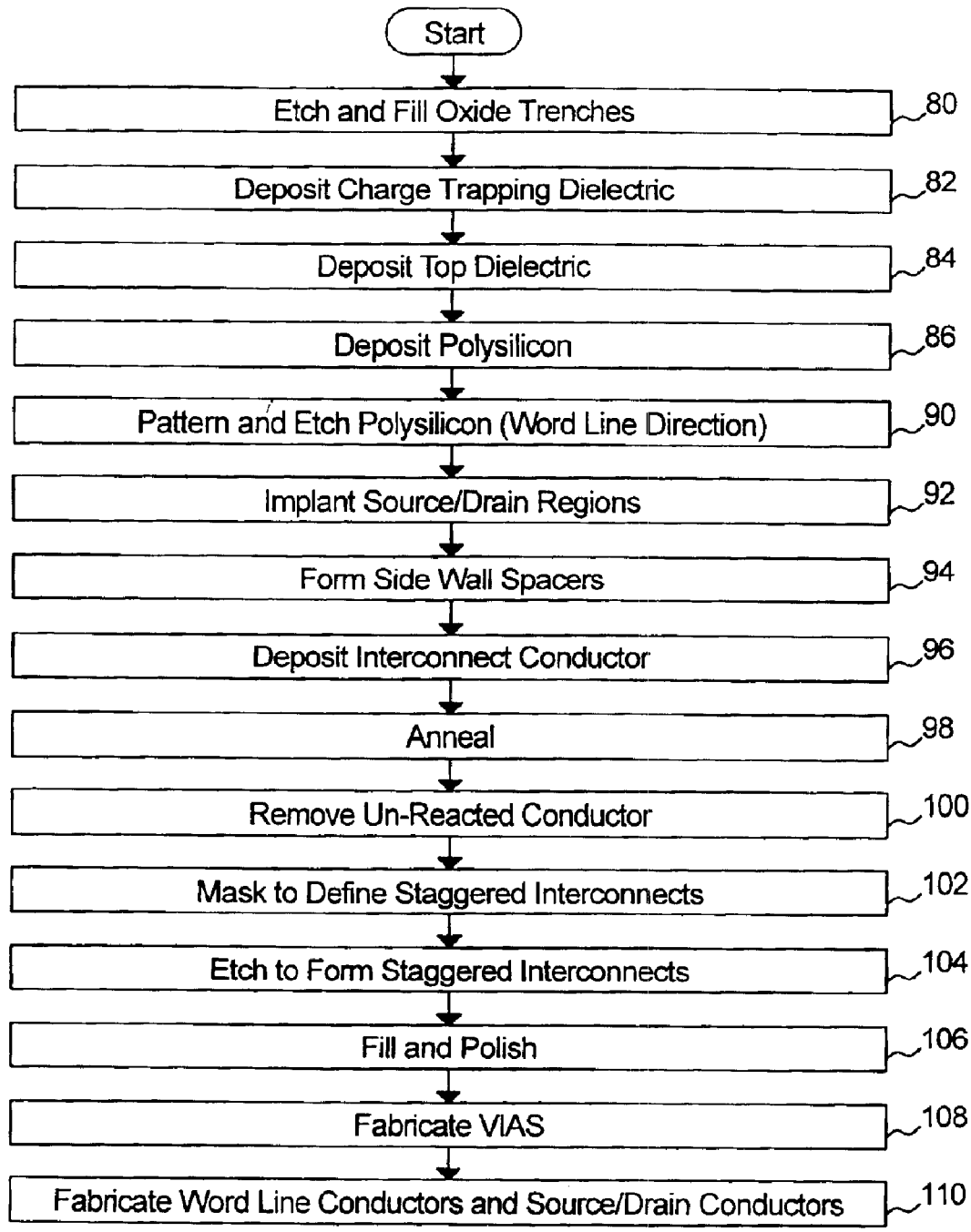
FIG. 6 is a flow chart representing exemplary processing steps for fabricating the charge trapping embodiment of the staggered local interconnect structure of FIG. 3.

FIG. 6 represents a flow chart of exemplary processing steps for fabricating charge trapping dielectric memory cell embodiment of the memory cell array 50. FIGS. 7 through 12 represent cross sectional views of a portion of the memory cell array 50 during selected processing steps.

Figure 7:
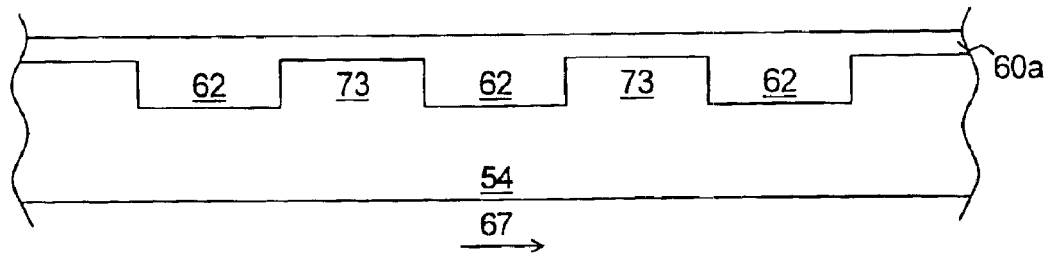
FIG. 7 represents a cross section of the charge trapping embodiment of the staggered local interconnect structure during a fabrication.

Step 80 represents etching and filling the oxide trenches 62 as is depicted in FIG. 7. More specifically, step 80 may comprise masking linear regions of the substrate 54 that cover column regions 73 (that will later become channel regions 58 and source/drain regions 64) while exposing linear regions of the substrate 54 wherein the oxide trenches 62 are to be formed. Thereafter, an anisotropic dry etch is used to form each trench, the mask is removed, and the trench is then backfilled with a compound such as TEOS. Following backfilling, the substrate 54 is exposed to a high temperature environment to convert the TEOS to silicon dioxide and is then polished to such the oxide trenches 62 as well as the tunnel layer 60a remain as is shown in FIG. 7.

Figure 8:
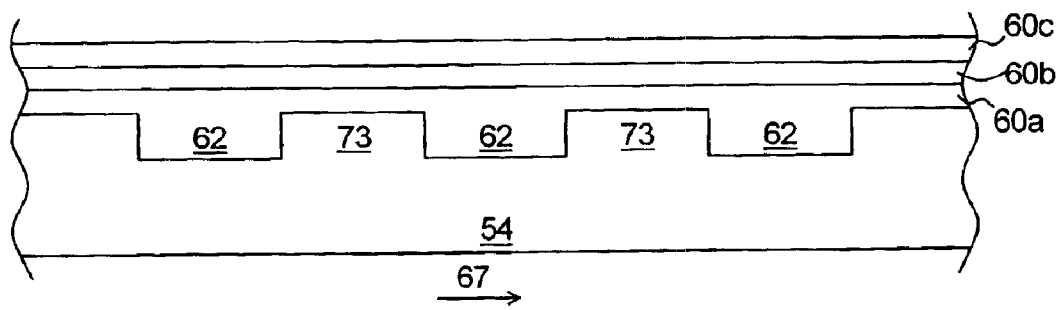
FIG. 8 represents a cross section of the charge trapping embodiment of the staggered local interconnect structure during a fabrication.

Step 82 represents fabricating the charge trapping dielectric layer 60b on the surface of the tunnel layer 60a, step 84 represents fabricating the top dielectric layer 60c on the surface of the charge trapping dielectric layer 60b as depicted in FIG. 8.

Figure 9:
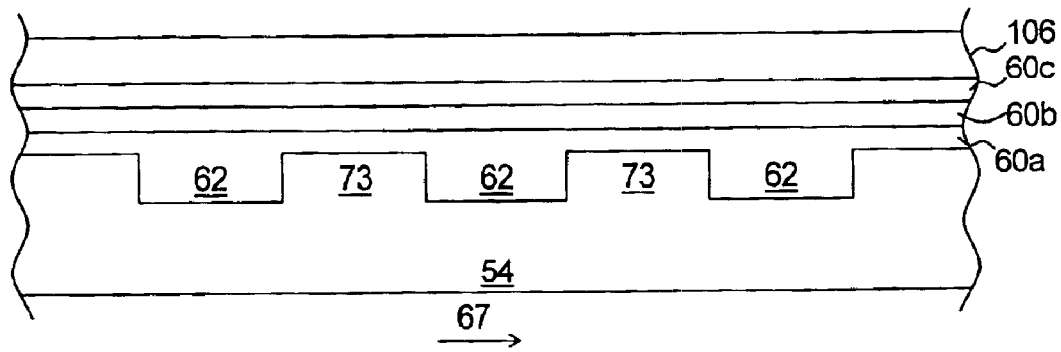
FIG. 9 represents a cross section of the charge trapping embodiment of the staggered local interconnect structure during a fabrication.

Step 86 represents depositing a gate electrode layer 106 across the entire surface including the top dielectric layer 60c as depicted in FIG. 9.

Figure 10A:
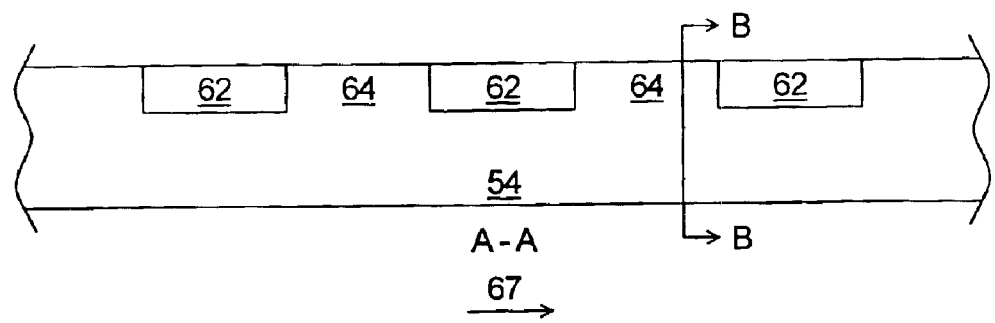
FIGS. 10a and 10b represents a cross section of the charge trapping embodiment of the staggered local interconnect structure during a fabrication.
Figure 10B:
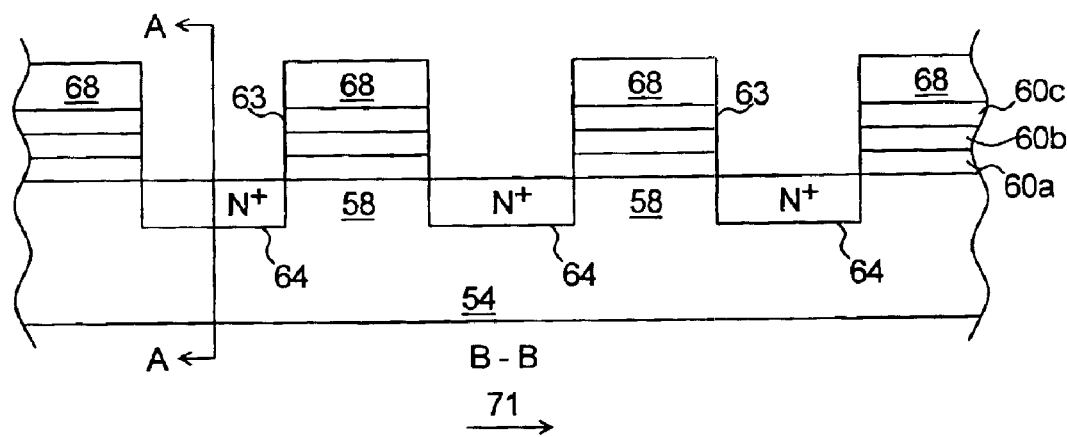

Step 90 represents patterning and etching trenches 110 within the gate electrode layer 106 in the horizontal row direction 67 as depicted in FIGS. 10a and 10b. The trenches 110 are spaced between portions of the gate electrode layer 106 that will become the word lines 68. Further, the trenches 110 are etched into each of the multilayer charge trapping dielectric layers 60a, 60b, and 60c in the source/drain direction (e.g. perpendicular to the word line direction) as is depicted in FIG. 10b.

Step 92 represents implanting the source/drain regions 64 to define alternating source/drain regions 64 and channel regions 58 within the column region 73 as is depicted in FIGS. 10a and 10b. More specifically, step 92 represents an implant of an electron donor impurity, such as arsenic, to form each source/drain region 64.

Figure 11A:
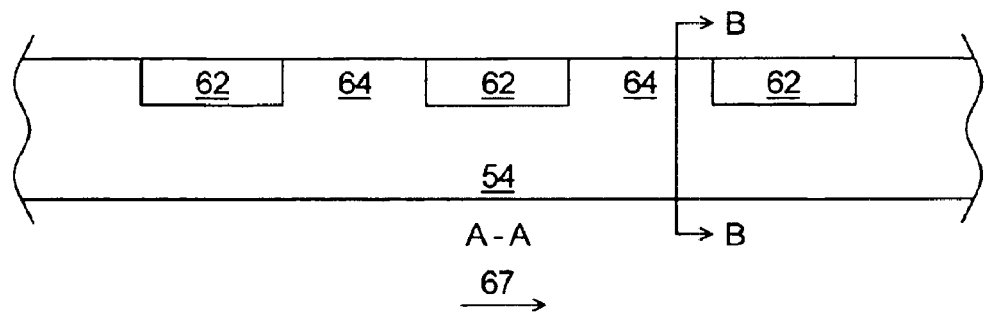
FIGS. 11a and 11b represents a cross section of the charge trapping embodiment of the staggered local interconnect structure during a fabrication.
Figure 11B:
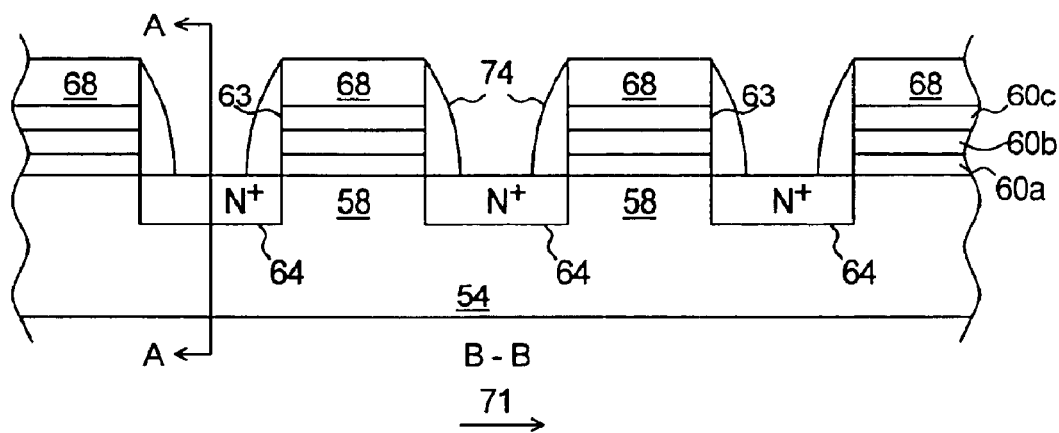

Step 94 represents fabricating the sidewall spacers 74 on the sides of the word lines 68 and on the sides of the exposed multilayer charge trapping dielectric 60*a*, 60*b* and 60*c* as is depicted in FIG. 11*b*. The side wall spacers 74 may be formed using known techniques of applying an insulator, such as a nitride compound, over the entire surface and performing an isotropic etch to remove the insulator form horizontal surfaces while the side wall spacers 74 remain.

Step 96 represents depositing an interconnect conductor such as cobalt across the surface which includes the exposed source/drain regions 64, the sidewall spacers 74, and the top surfaces of the word lines 68.

Step 98 represents a rapid thermal anneal cycle to react the interconnect conductor with underlying silicon to form a silicide such as cobalt silicide (CoSi) on the surface of the exposes source/drain regions 64 and the top surfaces of the word lines 68.

Step 100 represents removing the un-reacted interconnect conductor from the surfaces of the side wall spacers 74.

Figure 12A:
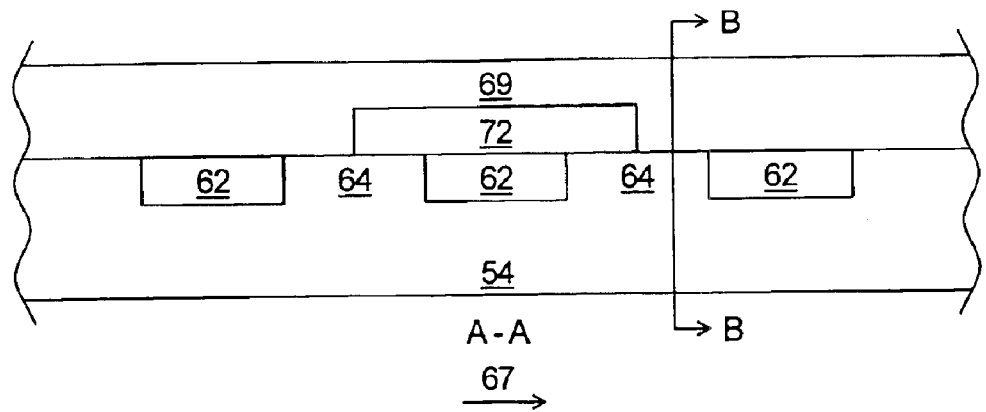
FIGS. 12a and 12b represents a cross section of the charge trapping embodiment of the staggered local interconnect structure during a fabrication.
Figure 12B:
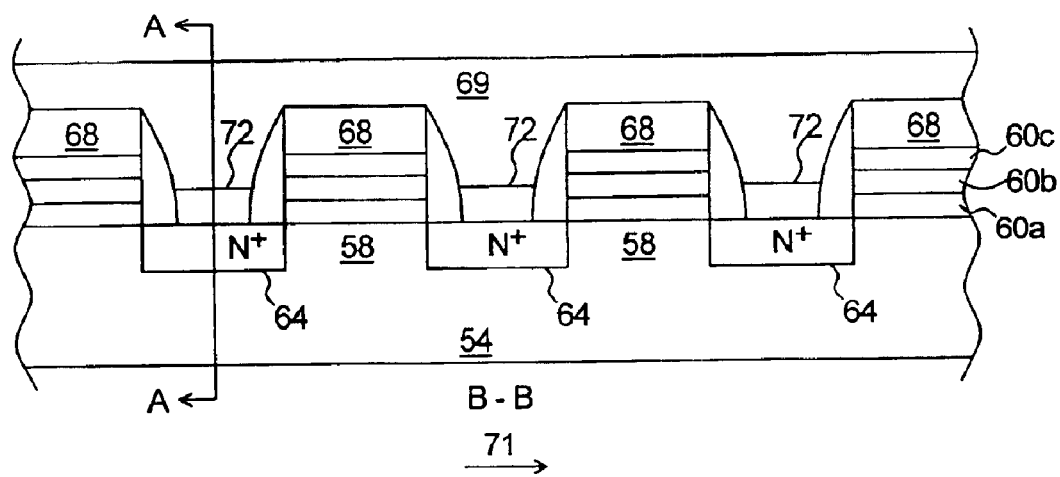
Figure 13A:
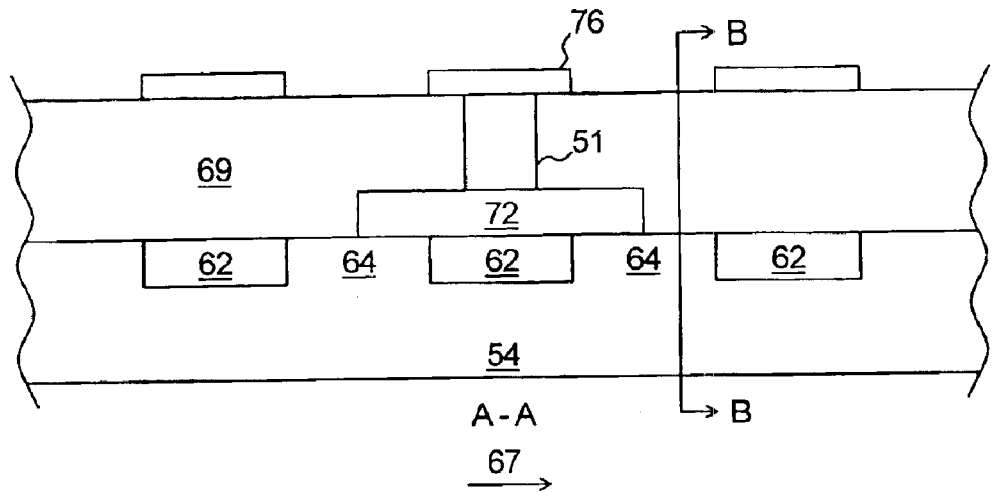
FIGS. 13a and 13b represents a cross section of the charge trapping embodiment of the staggered local interconnect structure during a fabrication.
Figure 13B:
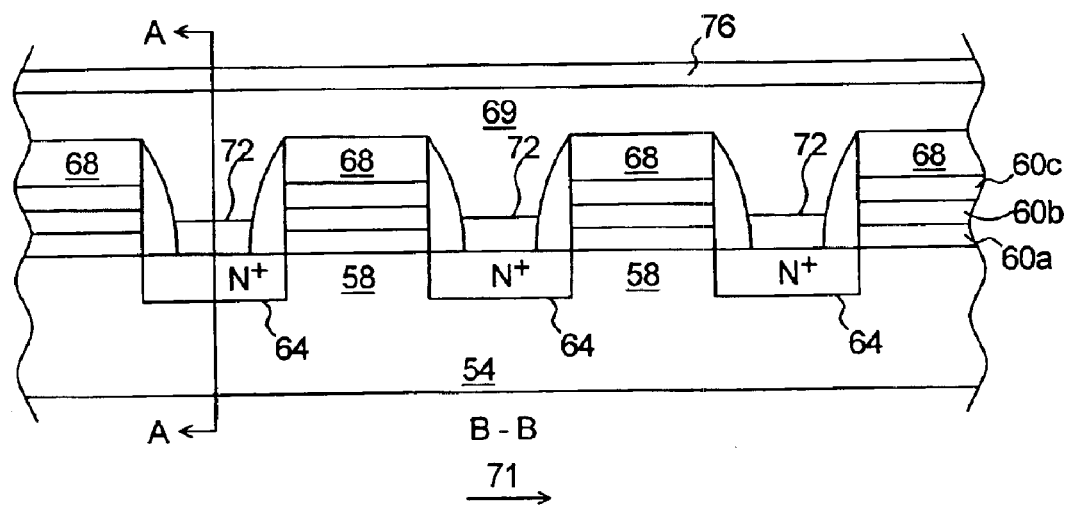

Step 102 represents masking to define the staggered interconnects 72 and step 104 represents etching the CoSi to form the staggered interconnects 72 between adjacent source/drain regions 64 as is depicted in FIGS. 12*a* and 12*b*.

Step 106 represents filling the regions above and around the staggered interconnects 72 with an insulator such as silicon dioxide 69 and polishing to provide a flat surface (and an insulating layer 69 across the top of the word lines 68) as is depicted in FIGS. 12*a* and 12*b*.

Step 108 represents fabricating vias 51 for coupling each of the staggered conductive interconnects 72 to one of the source drain control lines 70. More specifically, step 108 represents masking the surface and patterning the mask to expose the position of each via 51. Thereafter, the silicon dioxide 69 is etched form a hole and to expose each conductive interconnect. The hole is then filled with a conductor to form the via 51.

Step 110 represents fabricating the source/drain control lines 70 for interconnecting the vias on the surface. More specifically, step 110 may include applying a layer of a conductor such as a metal across the surface, masking the metal, and patterning the mask to cover the portions of the metal that will become the source/drain control lines 70 which interconnect all vias within a column. Thereafter, the metal is etched to form the source/drain control lines 70.

Fabrication of Floating Gate Embodiment

Figure 14:
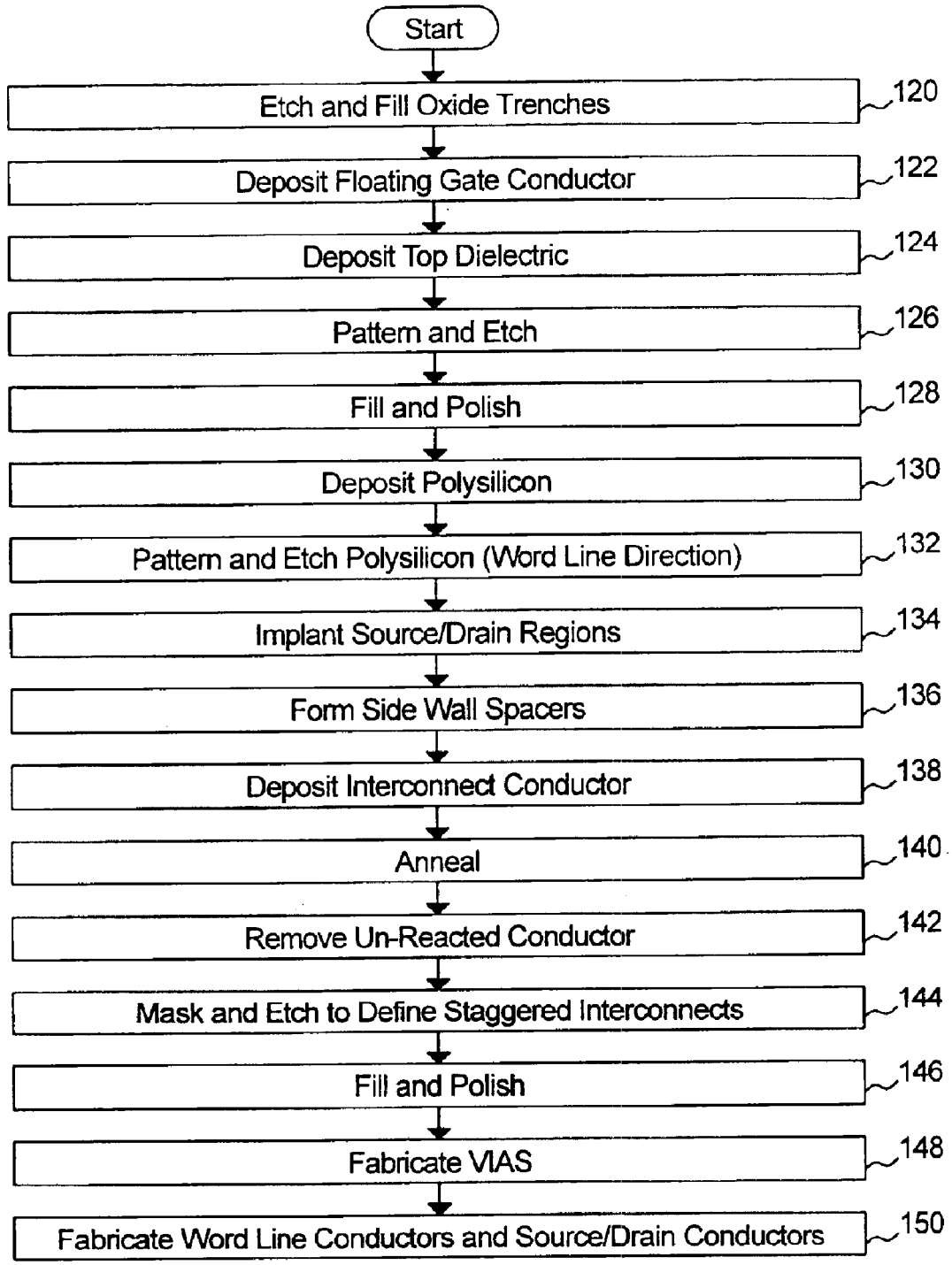
FIG. 14 is a flow chart representing exemplary processing steps for fabricating the floating gate embodiment of the staggered local interconnect structure of FIG. 3.

FIG. 14 represents a flow chart of exemplary processing steps for fabricating the floating gate memory cell embodiment of the memory cell array 50. FIGS. 15 through 22 represent cross sectional views of a portion of the memory cell array 50 during selected processing steps.

Figure 15:
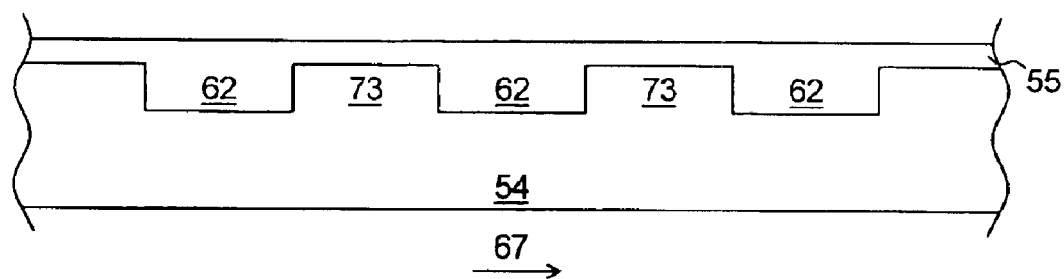
FIG. 15 represents a cross section of the floating gate embodiment of the staggered local interconnect structure during a fabrication.

Step 120 represents etching and filling the oxide trenches 62 as is depicted in FIG. 15. As discussed above with respect to step 60 (FIG. 6), etching and filling the oxide trenches 62 may comprise masking linear regions of the substrate 54 that cover the column region s 73 while exposing linear regions of the substrate 54 wherein the oxide trenches 62 are to be formed. Thereafter, an anisotropic dry etch is used to form each trench, the mask is removed, and the trench is then backfilled with a compound such as TEOS. Following backfilling, the substrate 54 is exposed to a high temperature environment to convert the TEOS to silicon dioxide and is then polished to such the oxide trenches 62 as well as the tunnel layer 55 remain as is shown in FIG. 15.

Figure 16:
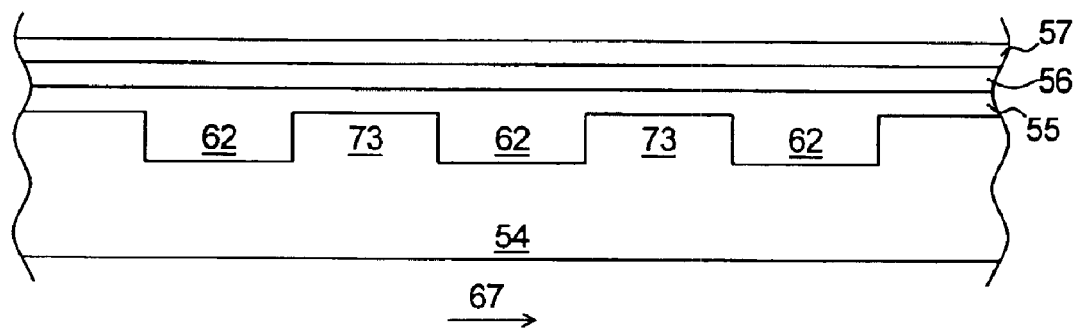
FIG. 16 represents a cross section of the floating gate embodiment of the staggered local interconnect structure during a fabrication.

Step 122 represents fabricating a floating gate conductor layer 56 on the surface of the tunnel layer 55 and step 124 represents fabricating the top dielectric layer 57 on the surface of the floating gate conductor layer 56 as depicted in FIG. 16.

Figure 17:
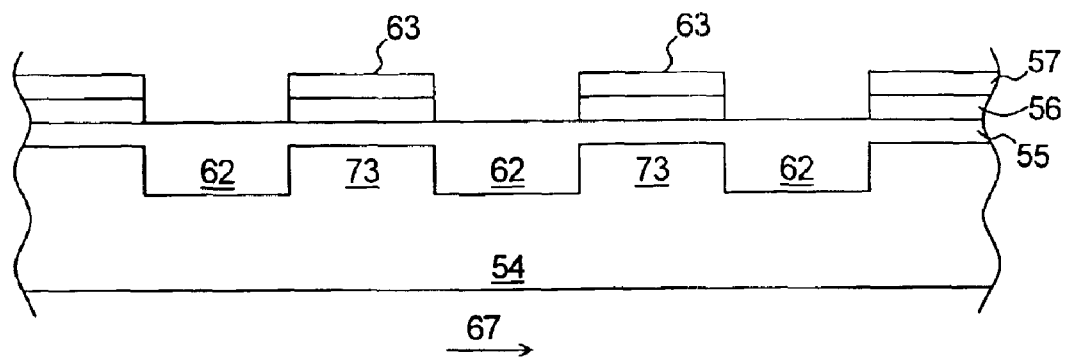
FIG. 17 represents a cross section of the floating gate embodiment of the staggered local interconnect structure during a fabrication.

Step 126 represents patterning and etching each of the top dielectric layer 57 and the floating gate layer 56 to form the charge storage cells 63 on the surface of the tunnel layer 55 as is shown in FIG. 17.

Figure 18:
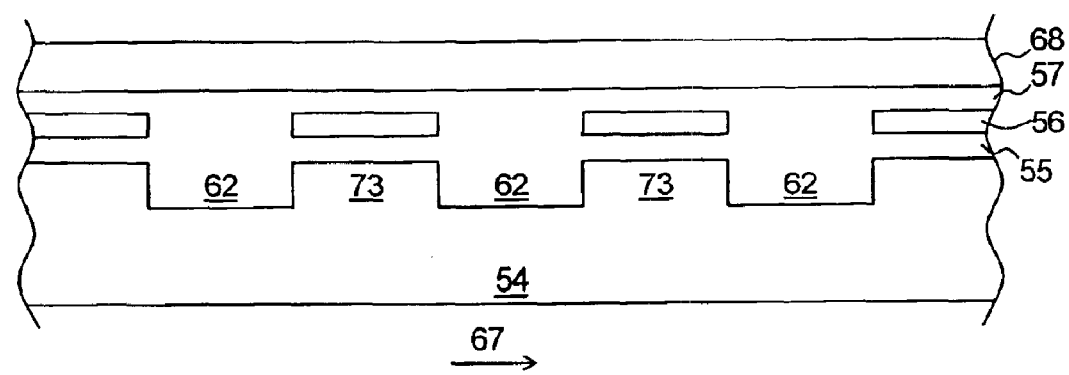
FIG. 18 represents a cross section of the floating gate embodiment of the staggered local interconnect structure during a fabrication.

Step 128 represents filling the regions etched at step 126 with an insulator and etching back or polishing flat for form the top dielectric layer 57 as is shown in FIG. 18.

Step 130 represents depositing a gate electrode layer 106 across the entire surface of the top dielectric layer 57 as depicted in FIG. 18.

Figure 19A:
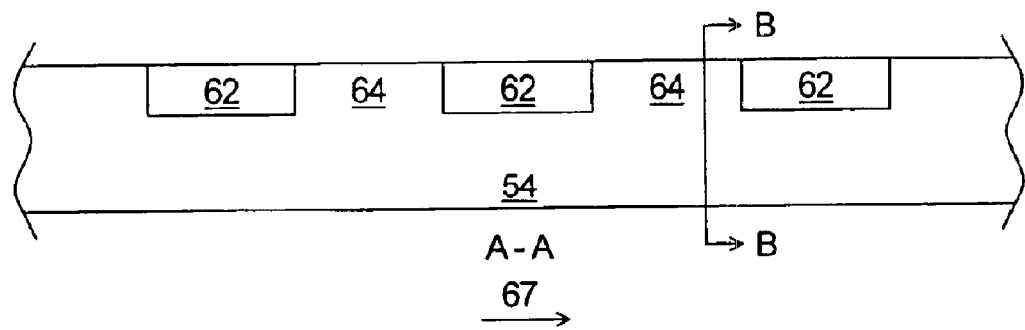
FIGS. 19a and 19b represents a cross section of the floating gate embodiment of the staggered local interconnect structure during a fabrication.
Figure 19B:
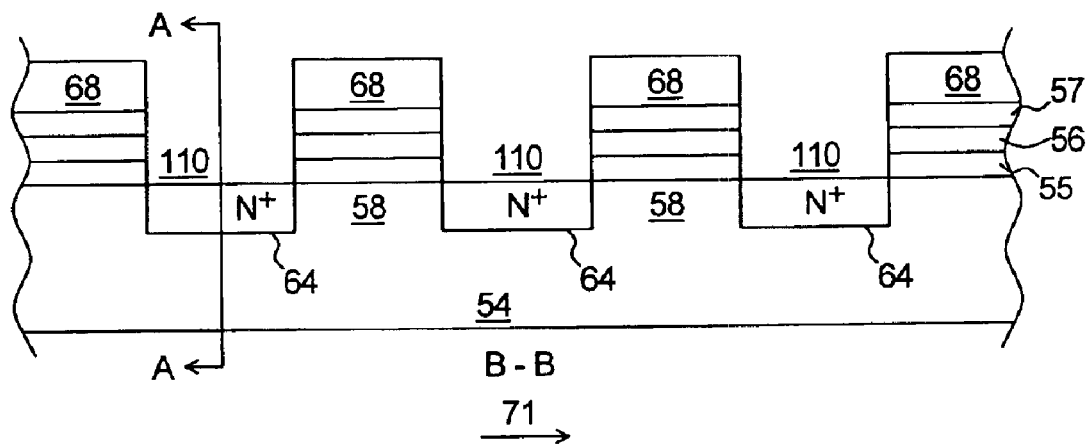

Step 132 represents patterning and etching trenches 110 within the gate electrode layer 106 in the word line direction as depicted in FIGS. 19*a* and 19*b*. The trenches 110 are spaced between portions of the gate electrode layer that will become the word lines 68. Further, the trenches 110 are etched into each of top dielectric layer 57, the floating gate layer 56, and the tunnel dielectric layer 55 as is depicted in FIG. 10*b*.

Step 134 represents implanting the source/drain regions 64 to define alternating source/drain regions 64 and channel regions 58 within the column region 73. More specifically, step 134 represents an implant of an electron donor impurity, such as arsenic, to form each source/drain region 64.

Figure 20A:
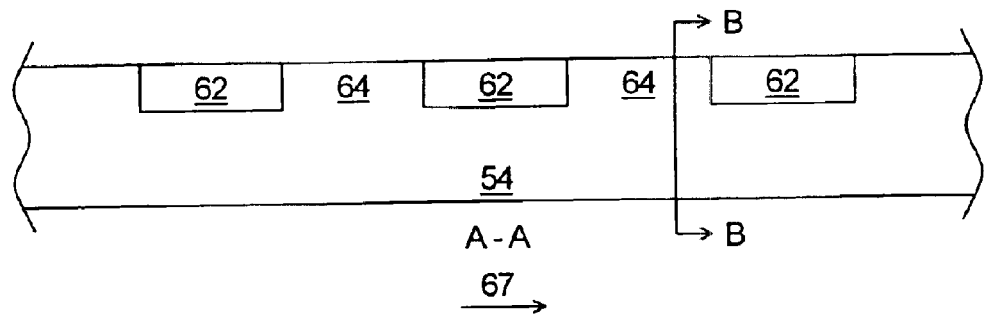
FIGS. 20a and 20b represents a cross section of the floating gate embodiment of the staggered local interconnect structure during a fabrication.
Figure 20B:
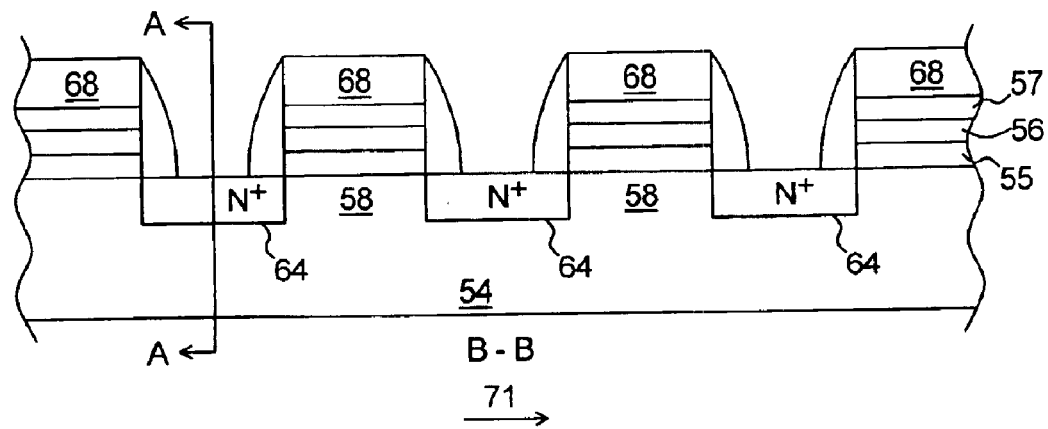

Step 136 represents fabricating the sidewall spacers 74 on the sides of the word lines 68 and on the sides of the top dielectric layer 57, the floating gate 56, and the tunnel dielectric layer 55 as is depicted in FIG. 20*b*. The side wall spacers 74 may be formed using known techniques of applying an insulator, such as a nitride compound, over the entire surface and performing an isotropic etch to remove the insulator form horizontal surfaces while the side wall spacers 74 remaining.

Step 138 represents depositing an interconnect conductor such as cobalt across the surface which includes the exposed source/drain regions 64, the sidewall spacers 74, and the top surfaces of the word lines 68.

Step 140 represents a rapid thermal anneal cycle to react the interconnect conductor with underlying silicon to form a silicide such as cobalt suicide (CoSi) on the surface of the exposes source/drain regions 64 and the top surfaces of the word lines 68.

Step 142 represents removing the un-reacted interconnect conductor from the surfaces of the side wall spacers 74.

Figure 21A:
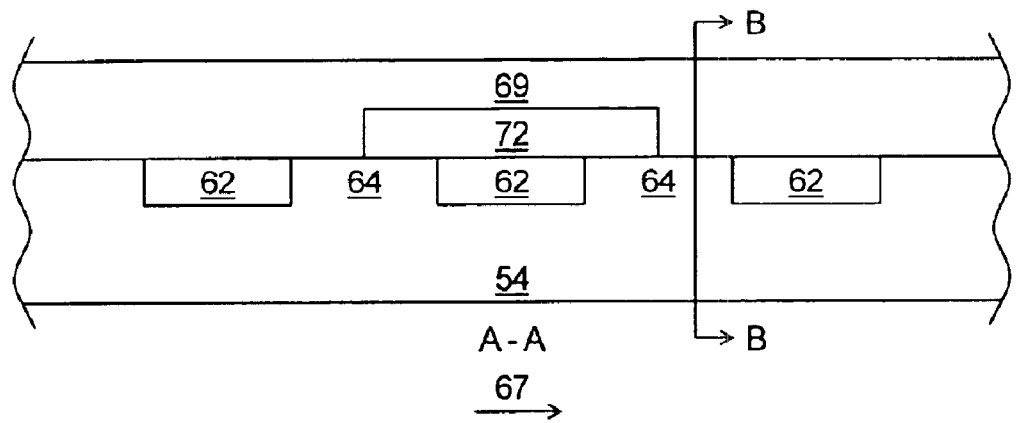
FIGS. 21a and 21b represents a cross section of the floating gate embodiment of the staggered local interconnect structure during a fabrication.
Figure 21B:
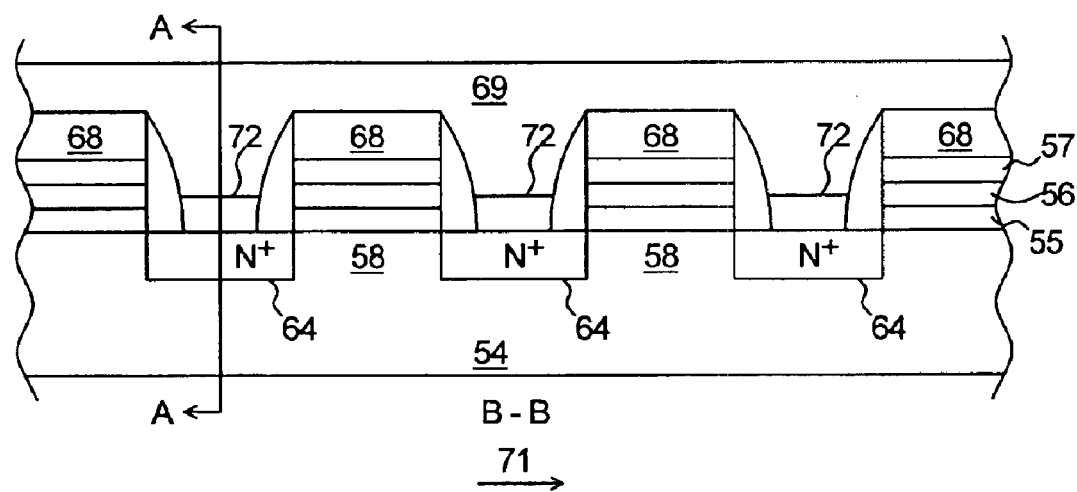
Figure 22A:
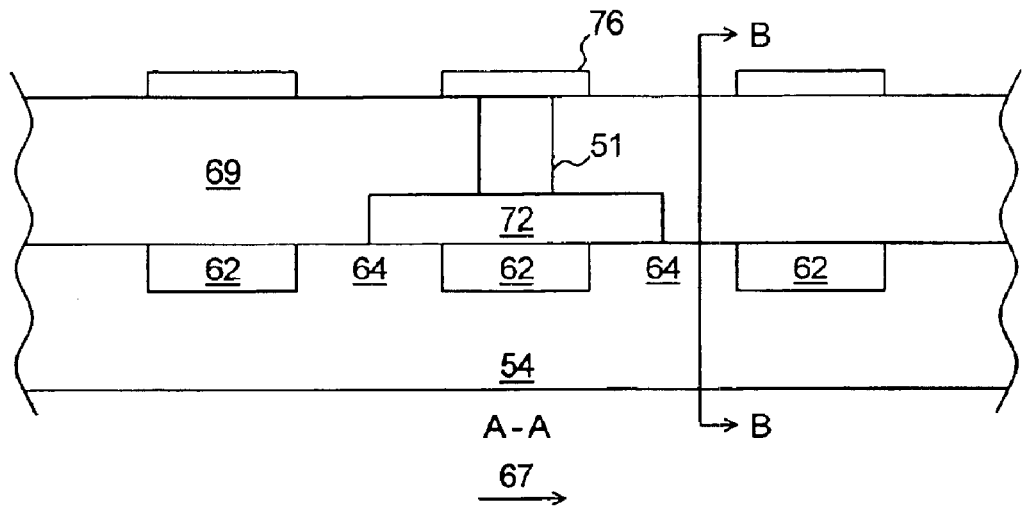
FIGS. 22a and 22b represents a cross section of the floating gate embodiment of the staggered local interconnect structure during a fabrication.
Figure 22B:
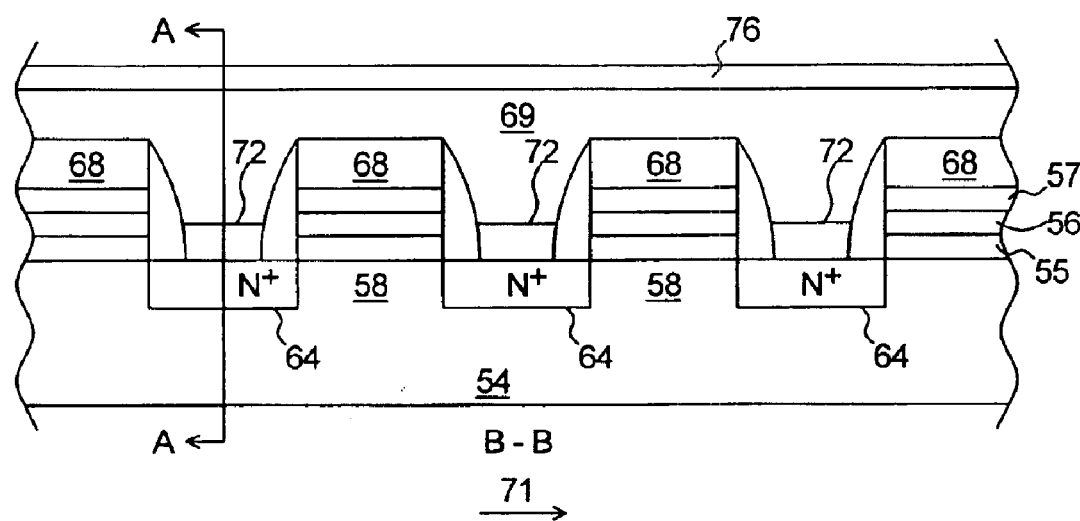

Step 144 represents masking to define the staggered interconnects 72 and etching the CoSi to form the staggered interconnects 72 between adjacent source/drain regions 64 as is depicted in FIGS. 21*a* and 21*b*.

Step 146 represents filling the regions above and around the staggered interconnects 72 with an insulator such as silicon dioxide 69 and polishing to provide a flat surface (and an insulating layer 69 across the top of the word lines 68).

Step 148 represents fabricating vias 51 for coupling each of the staggered conductive interconnects 72 to one of the source drain control lines 70. More specifically, step 148 represents masking the surface and patterning the mask to expose the position of each via 51. Thereafter, the silicon dioxide 69 is etched form a hole and to expose each conductive interconnect. The hole is then filled with a conductor to form the via 51.

Step 150 represents fabricating the source/drain control lines 70 for interconnecting the vias on the surface. More specifically, step 150 may include applying a layer of a conductor such as a metal across the surface, masking the metal, and patterning the mask to cover the portions of the metal that will become the source/drain control lines 70 which interconnect all vias within a column. Thereafter, the metal is etched to form the source/drain control lines 70.

Dual Bit Embodiment

Figure 23:
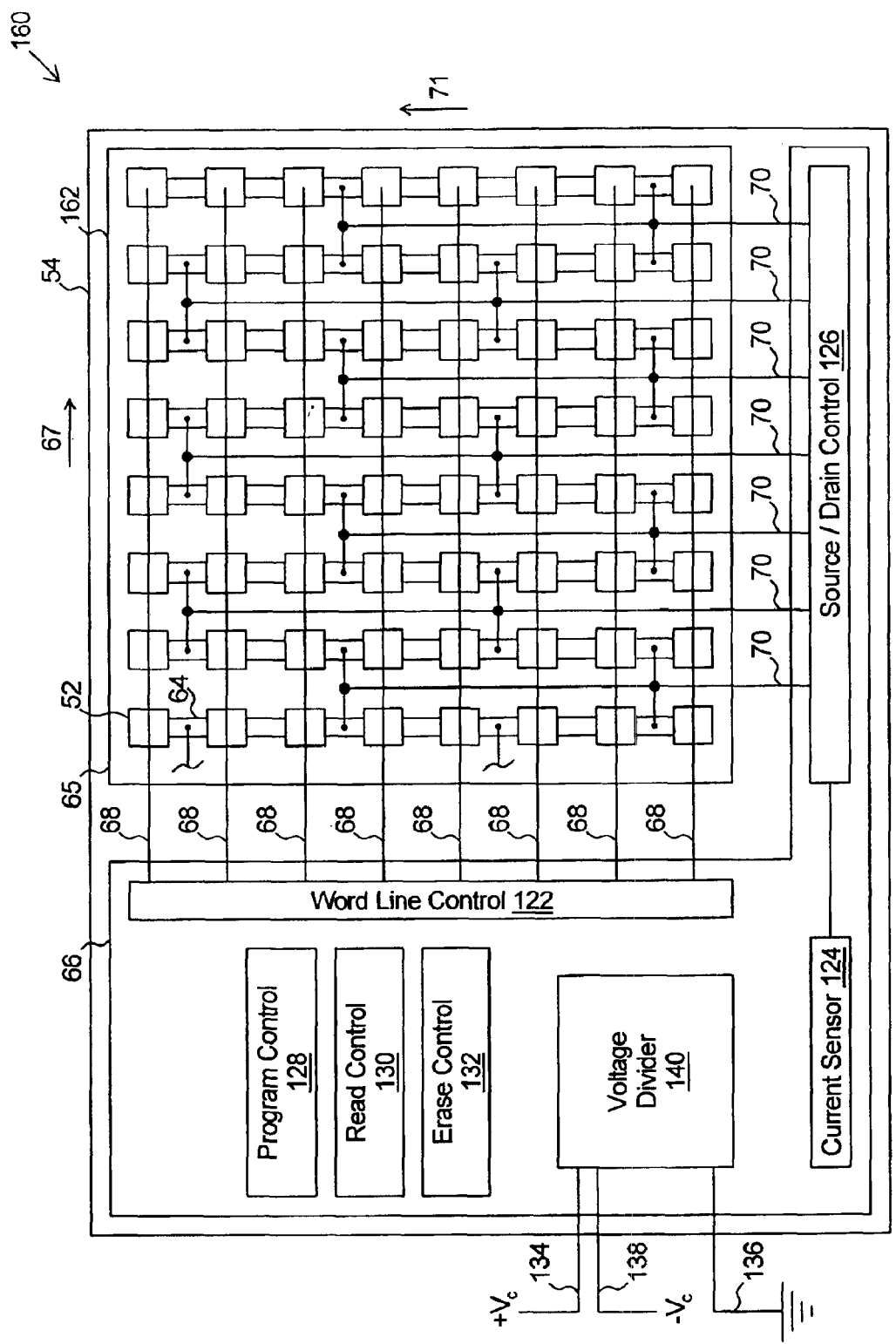
FIG. 23 is a block diagram representing a second exemplary embodiment of a staggered local interconnect structure memory array.

FIG. 23 represents a diagram of an alternative embodiment of an integrated circuit memory system 160. The system 160 comprises a staggered local interconnect charge storage memory cell array 162. The memory cell array 162 comprises a plurality of charge storage memory cells 52 fabricated in a core region 65 of a substrate 54 and control circuits fabricated in a periphery region 66 of the substrate 54.

The memory cell array 162 is arranged in a two dimensional array, or matrix, format with a plurality of rows or memory cells defining a horizontal row direction and a plurality of columns of memory cells defining a column direction.

Word lines 68 are positioned across the array 162 in a first direction (referred to as horizontal) and form a gate electrode over each of a plurality of memory cells 52 in a horizontal row. Source/drain control lines 70 are positioned across the array 162 in a second direction (referred to as vertical) that is perpendicular to the first direction and couples to a plurality of source/drain regions 64 which are positioned within the substrate 54 between pairs of adjacent word lines 68.

More specifically, each source/drain control line is positioned above the array 162 and couples to a plurality of vias 51. Each via 51 extends downward to only one conductive interconnect 72. Each conductive interconnect horizontally extends between two source/drain regions 64 that are adjacent in the horizontal direction. The plurality of interconnects 72 are arranged in a staggered pattern such that only every second source/drain region 64 within a column couples to only one interconnect 72 and such that the two source/drain regions 64 on opposing sides of two adjacent gates 64 (in the vertical direction) are coupled by the interconnects 72 and vias 51 to adjacent source drain control lines 70.

Stated another way, each conductive interconnect 72 is positioned above every second source/drain region 64 and couples to only one other source/drain region 64. The one other source/drain region 64 begin in a second column that is adjacent to the column and being in the same row as the source/drain region 64. The conductive interconnects 72 are positioned such that every other conductive interconnect 72 connects to the second source/drain region 64 in the adjacent column to a right side of the column and every other conductive interconnect 72 connects to the second source drain region in the adjacent column to the left side of the column.

It should be appreciated that in this embodiment, each cell includes one source/drain region 46 which floats. Control of the array 160 utilizes programming, reading, and erase techniques known and generally utilized for dual bit charge, trapping memory cell arrays. More specifically, the control circuits within the periphery region 66 may comprise transistor gate logic circuits that include a word line control circuit 122, a source/drain control circuit 126, a current sensor 124, a program control circuit 128, a read control circuit 130, an erase control circuit 132, a voltage divider circuit 140, a coupling to a positive operating power source (Vc) 134, a coupling to a negative operating power source (−Vc) 138, and a coupling to a ground 136. Each of such components may utilize known circuits for performing the functions disclosed herein.

In operation, the array control circuits operate to selectively couple each word line 68 and each source/drain line 70 to a voltage provided by the voltage divider 140 or to ground (or to isolate the word line 68 or the source/drain line 70 from all voltage sources and ground such that is potential is effected only by electrical interaction with other structure of the array 50). The coupling is in such a manner that each memory cell 52 within the array 50 can be erased, selectively programmed, and selectively read. The array control circuits also operates to couple a selected source/drain line 70 to the current sensor 124 such that a current on the selected source/drain line may be measured to indicate the programmed state of a selected memory cell 52.

It should also be appreciated that this dual bit embodiment can be fabricated utilizing the fabrication techniques described above with minor alterations to the steps of masking, pattering, and forming the conductive interconnects 72 and the vias 51.

In summary, the teachings herein provide a unique and smaller memory cell array with source/drain regions positioned on adjacent sides of channel regions in a column direction as opposed to a row direction as is the case in a traditional memory array. Further, the source/drain regions are each coupled to a conductive source/drain control lines which eliminates problems associated with high bit line resistances.

Although this invention has been shown and described with respect to certain preferred embodiments, it is obvious that equivalents and modifications will occur to others skilled in the art upon the reading and understanding of the specification. For example, Although the cells of the array are shown formed on the silicon substrate, it should be appreciated that the teachings of this invention may be applied to other dielectric memory cell structures which may be formed on suitable semiconductor substrates which include, for example, bulk silicon semiconductor substrates, silicon insulator (SOI) semiconductor substrates, silicon-on-sapphire (SOS) semiconductor substrates, and semiconductor substrates formed of other materials known in the art. The present invention includes all such equivalents and modifications, and is limited only by the scope of the following claims.

What is claimed is:

1. A memory cell array comprising:
 a two dimensional array of memory cells fabricated on a semiconductor substrate, the memory cells arranged in a plurality of rows of memory cells defining a horizontal row direction and a plurality columns of memory cells defining a column direction that is perpendicular to the horizontal row direction;
 each column of memory cells comprising a plurality of channel regions of the substrate, each channel region of the substrate being separated from an adjacent channel region within the column by a source/drain region, each source/drain region being a portion of the substrate that is implanted with a first impurity to form a first conductivity type semiconductor;
 a plurality of conductive interconnects, each conductive interconnect being positioned above only one source/drain region within a first column of the memory cells and coupling to only one other source/drain region, the one other source/drain region begin in a second column that is adjacent to the first column and being in the same row as the source/drain region, and wherein the conductive interconnects are positioned such that every other conductive interconnect connects to the second source/drain region in the adjacent column to a right side of the first column and every other interconnect connects to the second source/drain region in the adjacent column to the left side of the first column; and
 a plurality of source/drain control lines, extending above the array in the column direction and positioned between adjacent columns of memory cells and electrically coupling to each conductive interconnect that couples between a source/drain region in each of the adjacent columns.

2. The memory cell array of claim 1, further comprising:
a charge storage cell positioned above each channel region:
a plurality of conductive word lines, each conductive word line extending across the top of each charge storage cell within a row of memory cells and forming a gate electrode over each charge storage region within the row of memory cells.

3. The memory cell array of claim 2, wherein:
each of the source/drain control lines is spaced apart from each conductive interconnect; and
the array further includes a plurality of conductive vias, each conductive via extending from a source/drain control line to only one of the plurality of interconnects.

4. The memory cell array of claim 3, wherein:
The source/drain control lines are positioned above the word lines, and isolated from the word lines; and
each conductive via extends from the source/drain control line downward to the one of the plurality of interconnects between, and isolated from, adjacent word lines.

5. The memory cell array of claim 4, wherein:
each column of memory cells is separated from the adjacent column of memory cells by an insulator channel region within the substrate, the insulator channel region defining sides, in the horizontal direction, of each source/drain region and each channel region within the column of memory cells.

6. The memory cell array of claim 5, wherein:
each charge storage cell is a floating gate charge storage cell comprising:
a tunnel dielectric layer adjacent to the channel region;
a top dielectric layer adjacent to the word lines; and
a conductive gate positioned between the tunnel dielectric layer and the top dielectric layer.

7. The memory cell array of claim 5, wherein:
each charge storage cell is a charge trapping dielectric charge storage cell comprising:
a tunnel dielectric layer adjacent to the channel region;
a top dielectric layer adjacent to the word lines; and
a charge trapping dielectric positioned between the tunnel dielectric layer and the top dielectric layer.

8. A memory cell array comprising:
a two dimensional array of memory cells fabricated on a semiconductor substrate, the memory cells arranged in a plurality of rows of memory cells defining a horizontal row direction and a plurality columns of memory cells defining a column direction that is perpendicular to the horizontal row direction;
each column of memory cells comprising a plurality of channel regions of the substrate, each channel region of the substrate being separated from an adjacent channel region within the column by a source/drain region, each source/drain region being a portion of the substrate that is implanted with a first impurity to form a first conductivity type semiconductor;
a plurality of conductive interconnects, each conductive interconnect being positioned above only one source/drain region within the column of memory cells and couples to only one other source/drain region, the one other source/drain region begin in a second column that is adjacent to the first column and being in the same row as the source/drain region, and wherein the conductive interconnects are positioned such that a conductive interconnect is position above only every second source/drain region within a first column of memory cells and every second conductive interconnect within the first column of memory cells connects to the second source/drain region in the adjacent column to a right side of the first column and every other interconnect connects to the second source/drain region in the adjacent column to the left side of the first column; and
a plurality of source/drain control lines, extending above the array in the column direction and positioned between adjacent columns of memory cells and electrically coupling to each conductive interconnect that couples between a source/drain region in each of the adjacent columns.

9. The memory cell array of claim 8, further comprising:
a charge storage cell positioned above each channel region:
a plurality of conductive word lines, each conductive word line extending across the top of each charge storage cell within a row of memory cells and forming a gate electrode over each charge storage region within the row of memory cells.

10. The memory cell array of claim 9, wherein:
each of the source/drain control lines is spaced apart from each conductive interconnect; and
the array further includes a plurality of conductive vias, each conductive via extending from a source/drain control line to only one of the plurality of interconnects.

11. The memory cell array of claim 10, wherein:
The source/drain control lines are positioned above the word lines, and isolated from the word lines; and
each conductive via extends from the source/drain control line downward to the one of the plurality of interconnects between, and isolated from, adjacent word lines.

12. The memory cell array of claim 11, wherein:
each column of memory cells is separated from the adjacent column of memory cells by an insulator channel region within the substrate, the insulator channel region defining sides, in the horizontal direction, of each source/drain region and each channel region within the column of memory cells.

13. The memory cell array of claim 12, wherein:
each charge storage cell is a floating gate charge storage cell comprising:
a tunnel dielectric layer adjacent to the channel region;
a top dielectric layer adjacent to the word lines; and
a conductive gate positioned between the tunnel dielectric layer and the top dielectric layer.

14. The memory cell array of claim 12, wherein:
each charge storage cell is a charge trapping dielectric charge storage cell comprising:
a tunnel dielectric layer adjacent to the channel region;
a top dielectric layer adjacent to the word lines; and
a charge trapping dielectric positioned between the tunnel dielectric layer and the top dielectric layer.

15. A memory cell array comprising:
a two dimensional array of memory cells fabricated on a semiconductor substrate, the memory cells arranged in a plurality of rows of memory cells defining a horizontal row direction and a plurality columns of memory cells defining a column direction that is perpendicular to the horizontal row direction;

a plurality of insulator channels within the semiconductor substrate that extend in the column direction, each insulator channel extending between two adjacent columns of memory cells;

a plurality of generally rectangular channel regions within the semiconductor substrate, each channel region extending in the horizontal row direction between two of the insulator channels that are on opposing sides of the channel region and extending in the column direction by two semiconductor junctions, each semiconductor junction being a junction with a source/drain implant region of the substrate which is adjacent to, and on opposing sides of, the channel region;

a charge storage cell positioned above each channel region;

a plurality of word lines, each word line extending across the top of each charge storage cell within a row of memory cells and forming a gate electrode over each charge storage region within the row of memory cells; and a plurality of source/drain control lines, extending in the column direction between columns of memory cells and interconnecting to a plurality of conductive interconnects, wherein the plurality of interconnects are each coupled to only one source/drain control line and are arranged in a staggered pattern such that each source/drain region couples to only one interconnect and such that the two source/drain regions on opposing sides of each channel region, in the column direction, are each coupled by one of the conductive interconnects to separate and adjacent source/drain control lines.

16. The memory cell array of claim 15, wherein:

each of the source/drain control lines is spaced apart from each conductive interconnect; and the array further includes a plurality of conductive vias, each conductive via extending from a source/drain control line to only one of the plurality of interconnects.

17. The memory cell array of claim 16, wherein:

The source/drain control lines are positioned above the word lines, and isolated from the word lines; and each conductive via extends from the source/drain control line downward to the one of the plurality of interconnects between, and isolated from, adjacent word lines.

18. The memory cell array of claim 17, wherein:

each charge storage cell is a floating gate charge storage cell comprising:
 a tunnel dielectric layer adjacent to the channel region;
 a top dielectric layer adjacent to the word lines; and
 a conductive gate positioned between the tunnel dielectric layer and the top dielectric layer.

19. The memory cell array of claim 17, wherein:

each charge storage cell is a charge trapping dielectric charge storage cell comprising:
 a tunnel dielectric layer adjacent to the channel region;
 a top dielectric layer adjacent to the word lines; and
 a charge trapping dielectric positioned between the tunnel dielectric layer and the top dielectric layer.

20. A memory cell array comprising:

a two dimensional array of memory cells fabricated on a semiconductor substrates, the memory cells arranged in a plurality of rows of memory cells defining a horizontal row direction and a plurality columns of memory cells defining a column direction that is perpendicular to the horizontal row direction;

a plurality of insulator channels within the semiconductor substrate that extend in the column direction, each insulator channel extending between two adjacent columns of memory cells;

a plurality of generally rectangular channel regions within the semiconductor substrate, each channel region extending in the horizontal row direction between two of the insulator channels that are on opposing sides of the channel region and extending in the column direction between two semiconductor junctions, each semiconductor junction being a junction with a source/drain implant region of the substrate which is adjacent to, and on opposing sides of, the channel region;

a charge storage cell positioned above each channel region;

a plurality of word lines, each word line extending across the top of each charge storage cell within a row of memory cells and forming a gate electrode over each charge storage region within the row of memory cells; and a plurality of source/drain control lines, extending in the column direction between columns of memory cells and interconnecting to a plurality of conductive interconnects, wherein the plurality of interconnects are each coupled to only one source/drain control line and are arranged in a staggered pattern such that only every second source/drain region within a column couples to only one interconnect and such that:
 the two source/drain regions on opposing sides of two adjacent channel regions within a column are each coupled one of the conductive interconnects to separate and adjacent source/drain control lines; and
 a source/drain region between the two channel regions is isolated from all of the conductive interconnects.

21. The memory cell array of claim 20, wherein:

each of the source/drain control lines is spaced apart from each conductive interconnect; and the array further includes a plurality of conductive vias, each conductive via extending from a source/drain control line to only one of the plurality of interconnects.

22. The memory cell array of claim 21, wherein:

The source/drain control lines are positioned above the word lines, and isolated from the word lines; and each conductive via extends from the source/drain control line downward to the one of the plurality of interconnects between, and isolated from, adjacent word lines.

23. The memory cell array of claim 22, wherein:

each charge storage cell is a floating gate charge storage cell comprising:
 a tunnel dielectric layer adjacent to the channel region;
 a top dielectric layer adjacent to the word lines; and
 a conductive gate positioned between the tunnel dielectric layer and the top dielectric layer.

24. The memory array of claim 22, wherein:

each charge storage cell is a charge trapping dielectric charge storage cell comprising:
 a tunnel dielectric layer adjacent to the channel region;
 a top dielectric layer adjacent to the word lines; and
 a charge trapping dielectric positioned between the tunnel dielectric layer and the top dielectric layer.

* * * * *